(12) United States Patent
Karr et al.

(10) Patent No.: US 6,907,234 B2
(45) Date of Patent: Jun. 14, 2005

(54) SYSTEM AND METHOD FOR AUTOMATICALLY TUNING AN ANTENNA

(75) Inventors: Lawrence J. Karr, Santa Monica, CA (US); John Charles Gord, Venice, CA (US)

(73) Assignee: Microsoft Corporation, Redmond, WA (US)

( * ) Notice: Subject to any disclaimer, the term of this patent is extended or adjusted under 35 U.S.C. 154(b) by 359 days.

(21) Appl. No.: 10/277,636

(22) Filed: Oct. 21, 2002

(65) Prior Publication Data

US 2003/0119469 A1 Jun. 26, 2003

Related U.S. Application Data

(60) Provisional application No. 60/366,340, filed on Oct. 26, 2001.

(51) Int. Cl.[7] ................................................. H04B 1/18
(52) U.S. Cl. ............................... 455/193.1; 455/150.1; 455/129; 455/193.3
(58) Field of Search ........................... 455/193.1, 193.3, 455/196.1, 150.1, 129, 197.2, 191.2, 182.2, 192.1

(56) References Cited

U.S. PATENT DOCUMENTS

| 3,571,715 | A | * | 3/1971 | Beary et al. | ............. 455/193.3 |
| 4,761,796 | A | | 8/1988 | Dunn et al. | |
| 4,910,511 | A | | 3/1990 | Nagata et al. | |
| 5,038,405 | A | | 8/1991 | Karr | |
| 5,046,066 | A | | 9/1991 | Messenger | |
| 5,134,724 | A | | 7/1992 | Gehring et al. | ............. 455/274 |
| 5,136,719 | A | | 8/1992 | Gaskill et al. | ........... 455/193.1 |
| 5,243,356 | A | | 9/1993 | Hama | ........................ 343/718 |
| 5,263,183 | A | * | 11/1993 | Owen | ....................... 455/193.1 |
| 5,301,358 | A | | 4/1994 | Gaskill et al. | ............. 455/56.1 |
| 5,732,333 | A | | 3/1998 | Cox et al. | |
| 5,742,623 | A | | 4/1998 | Nuber et al. | |
| 5,757,782 | A | | 5/1998 | Gaskill | |
| 5,854,985 | A | | 12/1998 | Sainton et al. | |
| 5,884,140 | A | | 3/1999 | Ishizaki et al. | |
| 6,081,700 | A | * | 6/2000 | Salvi et al. | ............. 455/193.3 |
| 6,212,414 | B1 | | 4/2001 | Alameh et al. | |
| 6,236,842 | B1 | * | 5/2001 | Kobayashi | ............... 455/249.1 |

OTHER PUBLICATIONS

Gasgill et al., "High Speed Subcarrier Data System (HSDS)," *Seiko Communications*, Sep. 21, 1993, 14 pgs.
LTJ Designs, "Sinclair Watch Radio," last updated Jun. 6, 2000, 2 pgs.
Sinclair, "The FM Wristwatch Radio," last updated Jan. 7, 1997 1 pg.
Ambient, "Ambient Devices," Sep. 5, 2002, 3 pgs.
Ambient, "The Ambient Platform," Sep. 5, 2002, 2 pgs.

* cited by examiner

*Primary Examiner*—Edward F. Urban
*Assistant Examiner*—Blane J. Jackson
(74) *Attorney, Agent, or Firm*—Brett A. Hertzberg; Merchant & Gould P.C.

(57) ABSTRACT

An apparatus and method is related to a wireless system with an antenna that is automatically tuned to a desired frequency. The antenna is coupled to an adjustable tuning circuit to form a tuned antenna circuit that has a resonant frequency. The adjustable tuning circuit may be adjusted by activating a sweep generator that varies a tuning element over a broad frequency range. The sweep of the sweep generator is terminated after the proper frequency is found. Alternatively, the adjustable tuning circuit may be adjusted using an array of switched capacitors using a successive approximation method. The tuned antenna circuit may be employed to receive and/or transmit information. The resonant frequency is dynamically shifted in response to a data signal such that the antenna transmits FSK encoded signals.

33 Claims, 13 Drawing Sheets

SYSTEM AND METHOD FOR AUTOMATICALLY TUNING AN ANTENNA

RELATED APPLICATION

This utility patent application claims the benefit under 35 United States Code Section 119(e) of the U.S. Provisional Patent Application 60/366,340 filed Oct. 26, 2001.

FIELD OF THE INVENTION

The present invention relates generally to tuning an antenna in a radio receiver system, and more particularly to a method and system for tuning an antenna in a wireless radio receiver or transceiver system.

BACKGROUND OF THE INVENTION

Analog or digital information may be communicated to a remote receiver using a variety of communication theory techniques. A typical transmission system includes a transmitter, a communication channel, and a receiver. The transmitter converts the analog or digital information into a form that is suitable for transmission over the communication channel. The receiver recreates the original information from the transmitted signal. The communication channel may be any transmission medium such as wire, optical fiber, or merely free space in which the signals are transmitted as an electromagnetic wave (e.g., radio and television signals).

In a typical wireless communication system, a data signal that includes the information is modulated with a carrier signal and transmitted into free space with an antenna. The receiving system has an antenna and receiver that are tuned to the carrier frequency. The receiving system demodulates the received signal and extracts the data signal. The antenna that is used in the receiving system is usually closely tuned to the carrier frequency.

In portable devices, the physical dimensions of the antenna may be very small. In one portable device, an antenna may be formed in a wristband for a watch. A wristband antenna may be formed from a loop of wire that circumscribes the wrist of the wearer. Since the circumference of each wearer's wrist may be different, the resonant frequency of the antenna will also vary.

SUMMARY OF THE INVENTION

This summary of the invention section is intended to introduce the reader to aspects of the invention and is not a complete description of the invention. Particular aspects of the invention are pointed out in other sections herein below and the invention is set forth in the appended claims, which alone demarcate its scope.

The present invention is directed at providing a system and method for automatically tuning an antenna. Briefly described below is an exemplary apparatus and method that is directed to a wireless system with an antenna that is automatically tuned to a desired frequency. The antenna is coupled to an adjustable tuning circuit to form a tuned antenna circuit that has a resonant frequency. The adjustable tuning circuit may be adjusted by activating a sweep generator that varies a tuning element over a broad frequency range. The sweep of the sweep generator is terminated after the proper frequency is found. Alternatively, the adjustable tuning circuit may be adjusted using an array of switched capacitors using a successive approximation method. The tuned antenna circuit may be employed to receive and/or transmit information. The resonant frequency is dynamically shifted in response to a data signal such that the antenna transmits FSK encoded signals.

An apparatus that includes an antenna that is automatically tuned is also described below. The apparatus includes a tuned circuit that includes the antenna and an adjustable tuning circuit. The tuned circuit has a resonant frequency that is adjustable with a control signal. An amplifier circuit is arranged to provide an output signal in response to an input signal that is received from the tuned circuit. A feedback circuit is arranged to selectively couple at least a portion of the output signal to the tuned circuit. The tuned circuit, amplifier circuit, and feedback circuit operate as an oscillator that oscillates at the resonant frequency when the feedback circuit is active. A receiver circuit is tuned to a selected frequency. The receiver circuit is arranged to receive the output signal and to provide an indicator signal. The indicator signal indicates a signal level of signals received at the selected frequency. A tuning adjustment circuit is arranged to selectively provide the control signal. The control signal is adjusted until the signal level of the indicator signal exceeds a predetermined threshold. The signal level of the indicator signal exceeds the predetermined threshold when the resonant frequency of the tuned circuit is matched to the selected frequency of the receiver.

An illustrative method for automatically tuning an antenna in a wireless device is also described below. The method includes selecting a desired frequency. A control signal is initialized to a start value at the beginning of the tune mode. The start value corresponds to a frequency at one end of the operating spectrum of the wireless system. The antenna is arranged to oscillate at a resonant frequency with a tuning circuit. The tuning circuit has an adjustable tuning element that is arranged to adjust the resonant frequency in response to the control signal. A signal strength of the output signal at the selected frequency is determined. The control signal is changed to another value when the signal strength is below a predetermined threshold level. The control signal is maintained when the signal strength is above the predetermined threshold level. The resonant frequency is substantially the same as the selected frequency when the signal strength is above the predetermined threshold level such that the antenna is tuned.

Another illustrative method for using a tuned antenna in a wireless device is described below. The method includes arranging an antenna with a tuning circuit. The antenna and the tuning circuit form a tuned antenna circuit that has a resonant frequency. An operating mode and a desired frequency are selected. The tuned antenna circuit is coupled to an amplifier circuit when the operating mode is a tune mode such that the tuned antenna circuit oscillates at the resonant frequency. The resonant frequency is swept over a range of values when the operating mode is the tune mode and the resonant frequency is substantially different from the desired frequency. The sweep is stopped when the resonant frequency is substantially the same as the desired frequency and the operating mode is the tune mode.

A wireless watch device that includes an antenna that is automatically tuned to a selected frequency is also described. The device includes a means for tuning that is coupled to the antenna such that the antenna and the means for tuning have a resonant frequency. A means for amplifying is arranged to provide an output signal in response to an input signal from the antenna. A means for oscillating is arranged to provide feedback of the output signal to the antenna such that the antenna and the means for tuning oscillate at the resonant frequency when selected. A means for receiving is arranged to receive the output signal and provide a signal strength that indicates a level of the output signal that is tuned to the selected frequency. A means for discriminating is arranged to activate an enable signal when the signal strength is substantially below a predetermined threshold, and the enable signal is deactivated when the signal strength reaches or exceeds the predetermined threshold. A means for adjusting is arranged to adjust the resonant frequency of the means for tuning when the enable signal is active such that the resonant frequency is adjusted until tuned to the selected frequency.

Another apparatus that includes an antenna that is automatically tuned is also described. The apparatus includes a tuned circuit, an oscillator circuit, a comparator circuit, a counter circuit, and a successive approximation register. The tuned circuit includes the antenna and a tuning array. The tuned circuit has a resonant frequency that is associated with a tuning control signal that is provided to the tuning array. The oscillator circuit is coupled to the tuned circuit such that the tuned circuit and the oscillator circuit form a resonant circuit. The resonant circuit provides an antenna oscillation signal that oscillates at the resonant frequency when the oscillator circuit is enabled. The comparator circuit is coupled to the tuned circuit such that the comparator circuit produces a comparator output signal in response to the antenna oscillation signal when the comparator circuit is enabled. The counter circuit is coupled to the comparator circuit such that the counter detects a number of oscillations associated with the comparator output signal during a time interval. The successive approximation register is arranged to provide the tuning control signal. The tuning control signal is adjusted in response to a carryout signal from the counter at the end of the time interval when the successive approximation register is enabled.

Another method for automatically tuning an antenna is also described. The method includes: selecting a desired frequency, and initializing a tuning control signal to an initial value at the beginning of the tuning mode. The initial value of the tuning control signal corresponds to a frequency at one end of the operating spectrum. The method also includes configuring the antenna to oscillate such that the antenna provides an oscillator signal with an associated resonant frequency. The resonant frequency is related to the tuning control signal. The method further includes initiating tuning cycles when the tune mode is active. Each tuning cycle includes: counting a number of oscillations in the oscillator signal over the predetermined time interval, and adjusting the tuning control signal in response to the number of oscillations counted over the predetermined time interval.

Still another method for using an antenna is described. The method includes coupling the antenna to a tuning array such that the antenna and the tuning array form a tuned circuit that has a resonant frequency. An operating mode and a desired frequency are selected. An oscillator circuit is activated when the operating mode is a tune mode. The oscillator circuit excites the tuned circuit such that the tuned circuit oscillates at the resonant frequency. The method also includes adjusting the resonant frequency when the operating mode is the tune mode and the resonant frequency is substantially different from the desired frequency. Adjusting the resonant frequency includes: counting a number of oscillations in the tuned circuit over a time interval, activating additional elements in the tuning array when the number of oscillations in the tuned circuit is above a predetermined amount at the end of the time interval, and deactivating elements in the tuning array when the number of oscillations in the tuned circuit is below the predetermined amount at the end of the time interval.

An apparatus that includes an antenna for transmitting an information signal is also described. The apparatus includes a tuning array, a modulation tuner, an oscillator, and a phase detector. The tuning array, the modulation tuner, and the oscillator are coupled to the antenna. The tuning array is responsive to a tuning control signal, while the modulation tuner includes a tuning element that is responsive to a modulation control signal. The tuning array, the modulation tuner, and the antenna form a tuned circuit that has an associated resonant frequency. The oscillator and the tuned circuit form a resonant circuit that provides an antenna oscillation signal that oscillates at the resonant frequency when the oscillator circuit is enabled. The phase detector is arranged to provide the modulation control signal by comparing the phase of the antenna oscillation signal to an IF oscillation signal. The IF oscillation signal corresponds to a local oscillator signal that is modulated in response to the information signal. The resonant frequency of the tuned circuit changes in response to the information signal.

A method for transmitting an information signal with an antenna is also described. The method includes configuring the antenna to oscillate such that the antenna provides an antenna oscillator signal with an associated resonant frequency. An IF oscillator signal is generated, wherein the IF oscillator signal corresponds to a frequency shift keyed signal that is shifted in response to the information signal. The method also includes comparing the phase of the antenna oscillator signal to the phase of an IF oscillation signal to provide a phase difference signal. The resonant frequency is adjusted with a modulation tuner that is responsive to the phase difference signal such that the antenna transmits the information signal as an FM modulated signal using FSK encoding.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a", "an", and "the" include plural references. The meaning of "in" includes "in" and "on".

The present invention generally relates to a system and method that automatically tunes an antenna. A tunable antenna may be used as part of a system that includes an FM receiver, an amplifier, a feedback circuit, and a ramp generator. In one example, the amplifier receives the output of the antenna, and the output of the amplifier is selectively coupled to the antenna such that a positive feedback is created. The antenna, amplifier and feedback circuit form a resonating circuit. The FM receiver and ramp generator are configured as part of a control loop that adjusts the oscillation frequency of the resonating circuit until the resonant frequency closely matches the tuning frequency of the FM receiver. The resonant circuit may also be configured as a rudimentary FM transmitter as will be discussed in further details below.

The overall operating environment for the present invention will be discussed as follows below with reference to FIGS. 1 and 2.

Operating Environment

Figure 1:
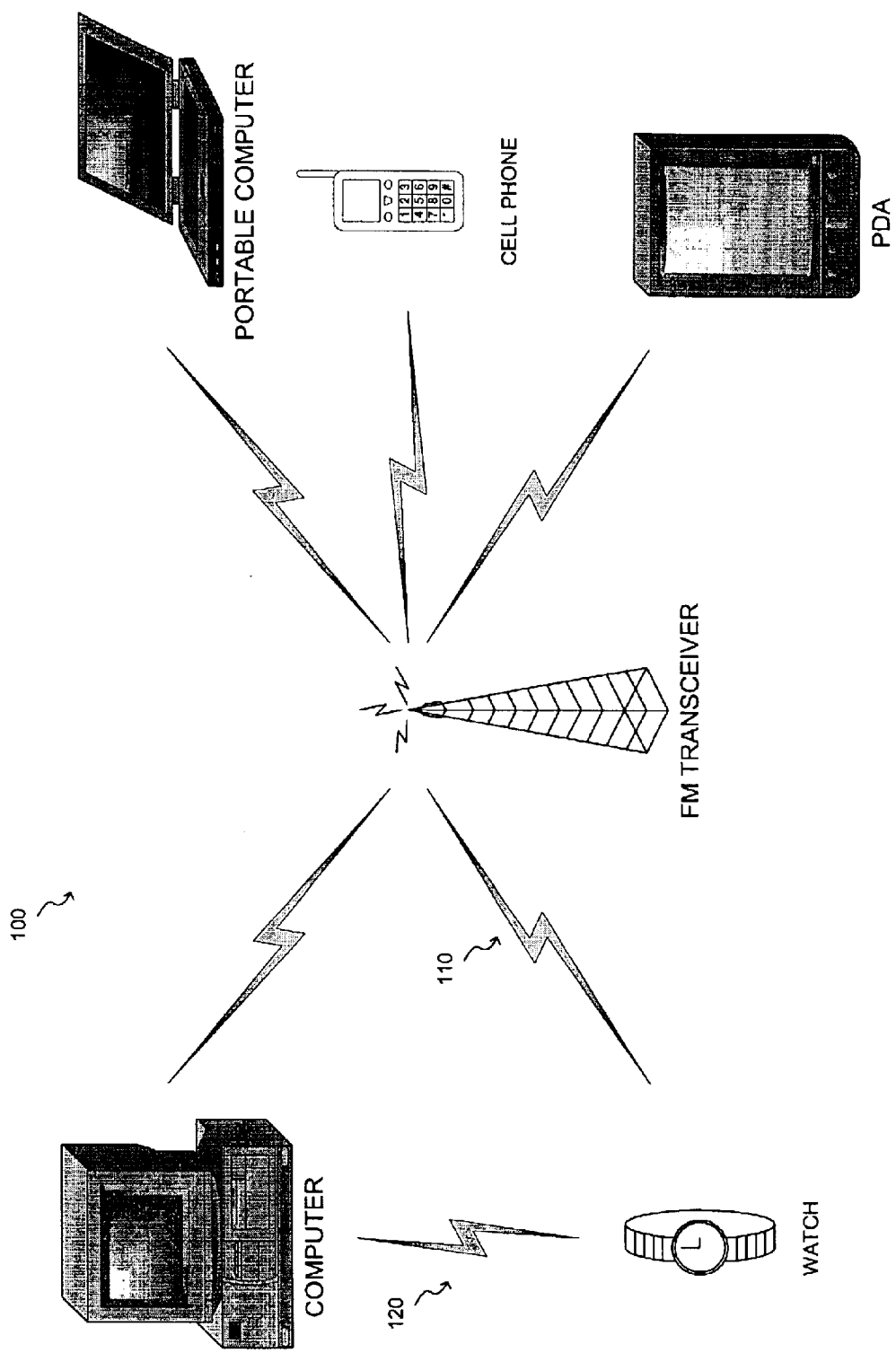
FIG. 1 illustrates an operating environment.

FIG. 1 illustrates an exemplary operating environment (100) for the present invention. As illustrated in the figure, an FM transceiver or broadcast is transmitted over a communication channel (110) to various electronic devices. Example electronic devices that have an FM receiver or transceiver may include a desktop computer, a watch, a portable computer, a wireless cellular telephone (cell phone), and a personal data assistant (PDA). The electronic devices are arranged to receive information from the FM broadcast. The FM broadcast may be of any number of types including but not limited to: a standard FM transmission, a sub-carrier FM transmission, or any other type of FM transmission as may be desired.

FM sub-carriers are often referred to as an SCA as identified by the Federal Communications Committee (FCC) term for the Subsidiary Communications Authorization. An FM sub-carrier utilizes bandwidth that is otherwise unused in the FM stereo-band about an FM station. In the United States of America the FCC requires the modulation bandwidth to be roughly from 53 KHz to 100 KHz within the modulation bandwidth of the FM station.

The electronic devices may also include facilities to communicate with other electronic devices over an alternative communication channel (120) in another operating mode. In this case, the electronic devices operate as local broadcast ("local cast") transceivers that receive and transmit over a limited distance. In the local cast mode data may be communicated among electronic devices over the alternative communication channel (120) using a direct frequency shift keyed (FSK) modulation, or any other type of modulation method that is adequate for a local short range transceiver operation.

Figure 2:
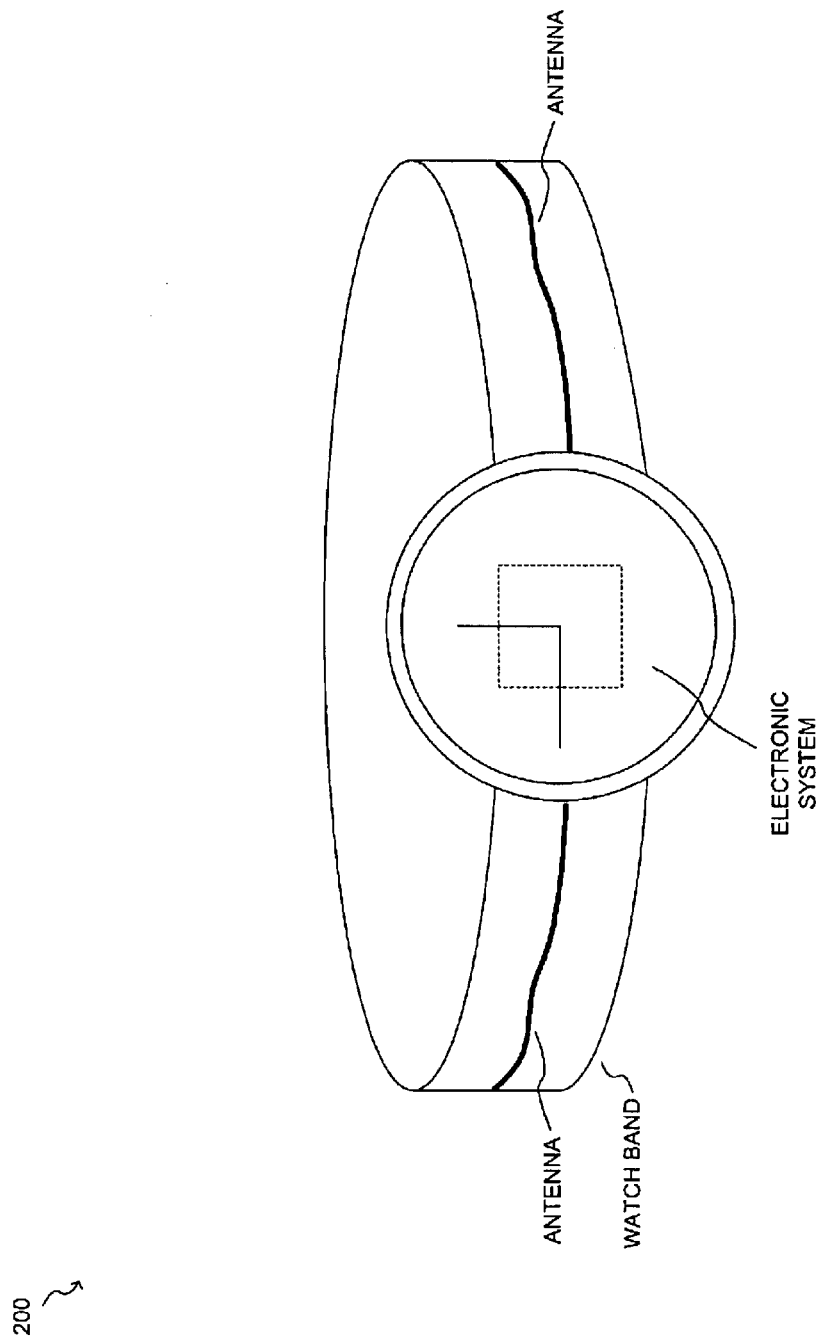
FIG. 2 illustrates an exemplary wireless apparatus.

FIG. 2 illustrates an exemplary watch device (200) that includes an electronic system that is arranged to operate as either a receiver or transceiver type of device. As illustrated in the figure, the watchband includes an antenna that is either attached to the watchband or integrally formed within the watchband. The antenna is coupled to the electronic system that is contained in the watch. The electronic system may be contained in the bezel as shown in FIG. 2, or in some other portion of the watch device (not shown). The electronic system includes an automatically tuned antenna system.

The quality factor (Q) in an antenna is a figure of merit that indicates the selectivity of the antenna. In other words, the Q of the antenna corresponds to the ratio of the center frequency over the bandwidth. The Q for a lossless loop antenna with a relatively long wavelength (λ) and a radius (r) of the circumscribed sphere around the wristband is given by:

$$Q \geq \left(\frac{\lambda}{2\pi r}\right)^3$$

The circumferences of most wrists are usually within the range from 14 cm to 21 cm. These circumferences provide a Q on the order of 5000 for frequencies operating in the 100 MHz range (FM band). However, electrical losses are realized due to the electrical conductivity of skin tissue and other non-ideal factors such that the non-ideal Q is achieved on the order of 50. The overall signal level that is achieved in a wristband antenna is relatively low due to various inefficiencies.

The present invention has identified that an antenna can be dynamically tuned and retuned to account for various inefficiencies and non-ideal effects in the antenna. The operation of the automatically tuned antenna system will be discussed as follows below.

Figure 3:
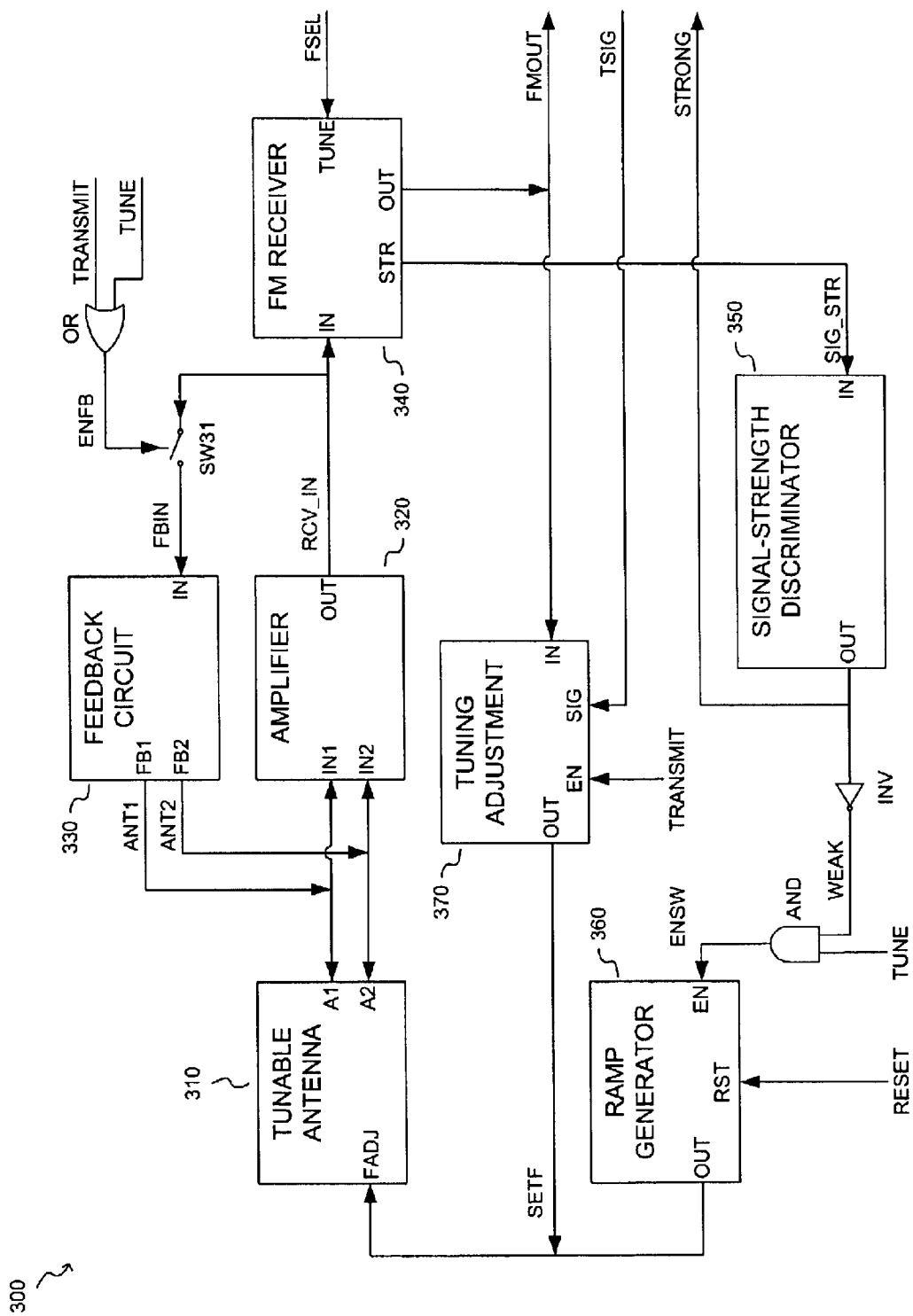
FIG. 3 is a block diagram of an exemplary automatic tuning system.
Figure 4:
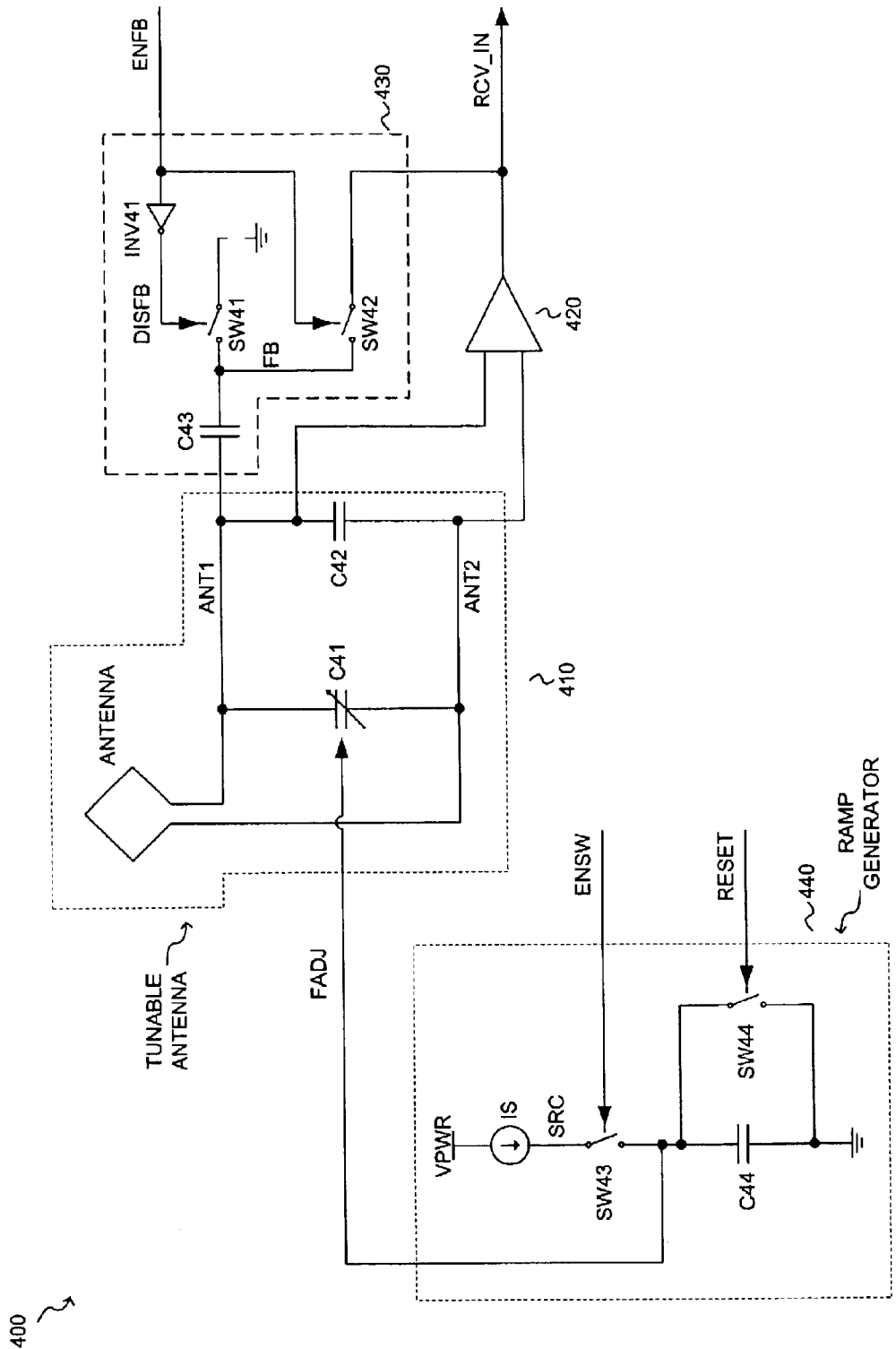
FIG. 4 is a schematic diagram illustrating a portion of an exemplary automatic antenna tuning system.
Figure 10:
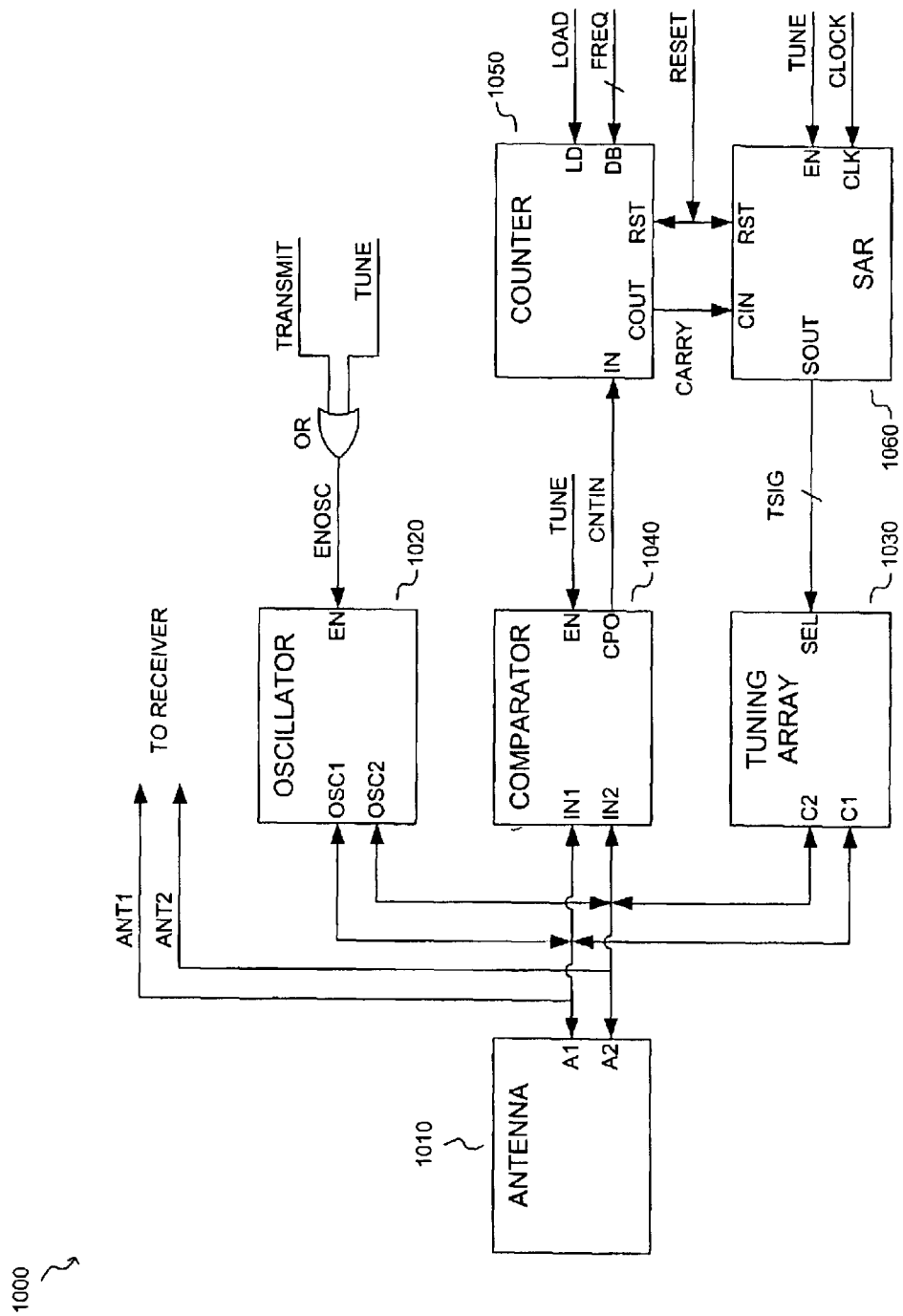
FIG. 10 illustrates a portion of another illustrative automatically tuned antenna system.
Figure 11:
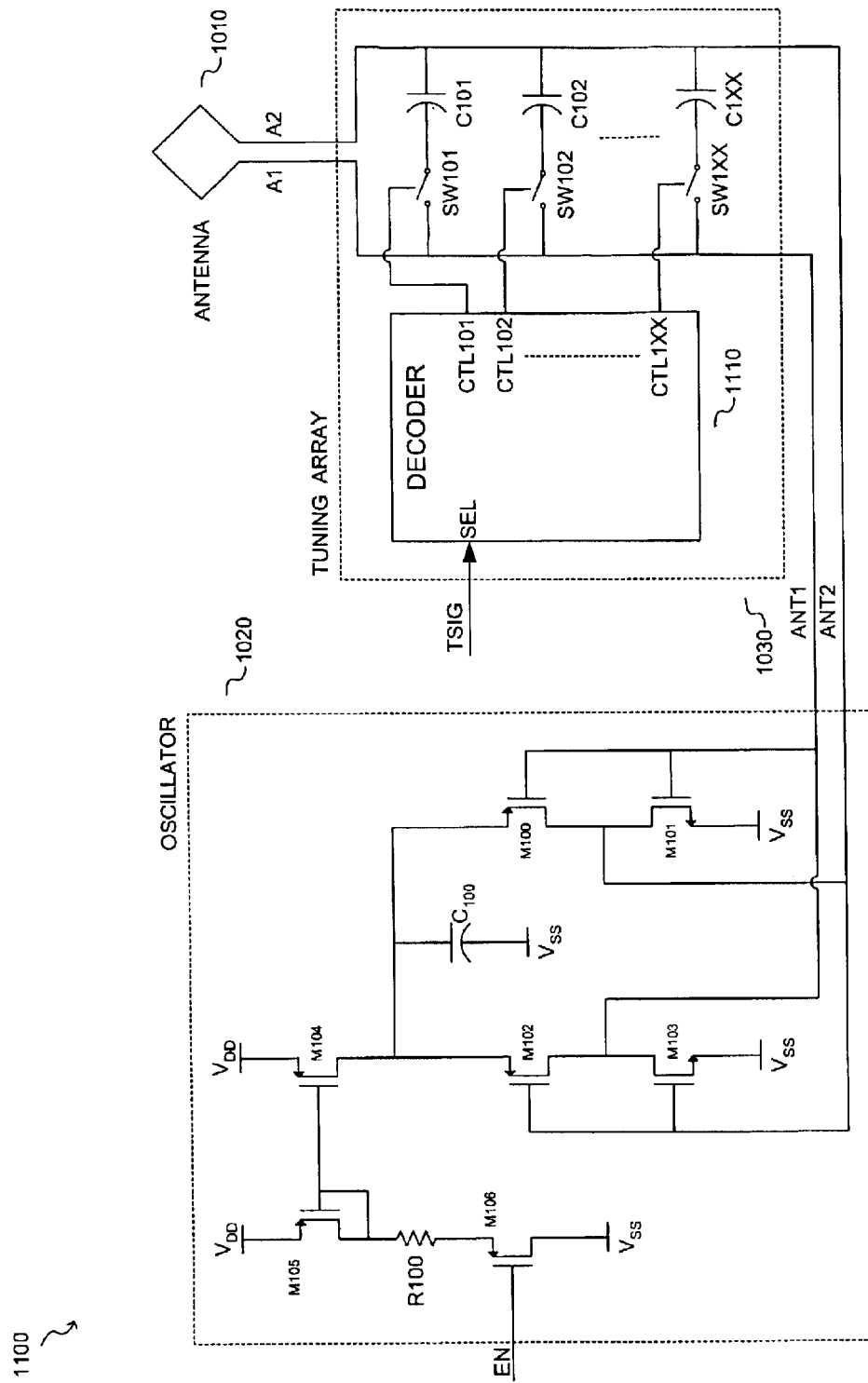
FIG. 11 illustrates an exemplary antenna tuning circuit that is compatible with the system illustrated in FIG. 10.
Figure 12:
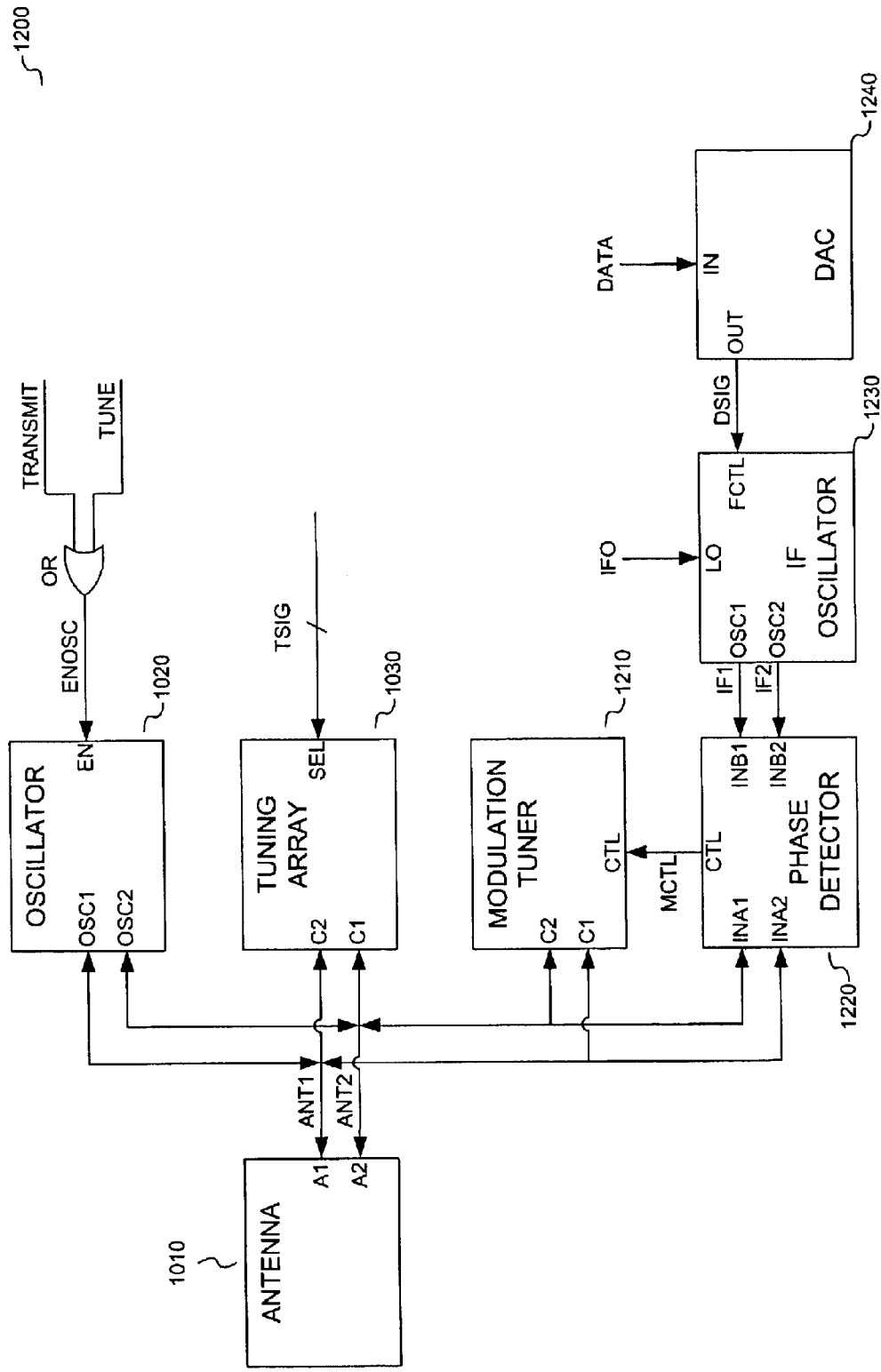
FIG. 12 illustrates an exemplary transmission system that is compatible with the antenna tuning system that is shown in FIG. 10.

FIG. 3 is an exemplary system level diagram, while FIG. 4 illustrates another exemplary detail in an automatic tuned antenna system. FIGS. 6–9 are system flow diagrams that illustrate various operating modes for the automatic tuned antenna system. FIG. 10 is another exemplary system level diagram, while FIG. 11 illustrates another exemplary detail in an automatic tuned antenna system. FIG. 12 is a system flow diagram that illustrates another procedure for the automatic tuned antenna system.

System Operation

FIG. 3 illustrates an overview of an illustrative automatically tuned antenna system (300). The automatically tuned antenna system (300) includes a tunable antenna (310), an amplifier (320), a feedback circuit (330), an FM receiver (340), a signal strength discriminator (350), a ramp generator (360), a tuning adjustment circuit (370), a switch (SW31), an inverter (INV), an AND logic gate, and an OR logic gate.

Antenna 310 has two antenna terminals (A1, A2) that are coupled to nodes ANT1 and ANT2 respectively, and a frequency adjustment terminal (FADJ) that is coupled to SETF. Amplifier 320 includes input terminals (IN1, IN2) that are coupled to ANT1 and ANT2 respectively, and an output terminal (OUT) that is coupled to RCV_IN. Switch SW31 has an input terminal that is coupled to RCV_IN, an output terminal that is coupled to FBIN, and a control terminal that is coupled to ENFB. Logic gate OR has an input terminal that is coupled to TUNE, another input terminal that is coupled to TRANSMIT, and an output terminal that is coupled to ENFB. FM Receiver 340 has a first input terminal (IN) that is coupled to RCV_IN, a second input terminal (TUNE) that is coupled to FSEL, an output terminal (STR) that is coupled to SIG_STR, and another output terminal (OUT) that is coupled to FMOUT. Signal-strength discriminator 350 has an input terminal that is coupled to SIG_STR, and an output terminal that is coupled to STRONG. Logic gate INV has an input terminal that is coupled to STRONG and an output terminal that is coupled to WEAK. Logic gate AND has an input terminal that is coupled to WEAK, another input terminal that is coupled to TUNE, and an output terminal that is coupled to ENSWEEP. Ramp generator 360 has an input terminal (EN) that is coupled to ENSWEEP, another input terminal (RST) that is coupled to RESET, and an output terminal (OUT) that is coupled to SETF. Tuning adjustment 370 includes a first input terminal (IN) that is coupled to FMOUT, a second input terminal (TSIG) that is coupled to SIG, a third input terminal (EN) that is coupled to TRANSMIT, and an output terminal (OUT) that is coupled to SETF.

The system shown in FIG. 3 has at least three operating modes. The first operating mode is a tune mode. The second operating mode is a receive mode. The third operating mode is a transmit mode. In operation, additional electronics (not shown) are used to provide control signals (TUNE, TRANSMIT, RESET, FSELECT, and TSIG), and to process the output (FMOUT) of FM receiver 340. The additional electronics (not shown) may include a controller such as a microprocessor, microcontroller, or another circuit that is arranged to selectively control the control signals.

The basic operation of the various modes will be described as follows below.

Tuning Mode

In the tuning mode, the TUNE signal is set to a high logic level (logic "1"), and the TRANSMIT signal is set to a low logic level (logic "0"). These signals cause the OR logic gate to set ENFB to a high signal level (logic "1"), which closes switch SW31. While switch SW31 is closed, RCV_IN is coupled to the FBIN causing a positive feedback path to be formed with tuned antenna 310, amplifier 320, and feedback circuit 330. The positive feedback path results in a resonant circuit that oscillates at a frequency (FOSC) that is controlled by the frequency adjustment input (FADJ) of tunable antenna 310. Thus, RCV_IN will be an oscillating signal during the tune mode.

The FSEL signal provides a tuning signal to FM receiver 340 such that FM receiver 340 is tuned to a selected FM channel. FM receiver 340 includes a signal strength indicator that is arranged to provide a signal strength signal (SIG_STR) that indicates that magnitude of the signal strength received on the selected FM channel. Signal-strength discriminator 350 is arranged to provide a high logic level (logic "1") output when SIG_STR exceeds a predetermined threshold. Thus, STRONG is a low logic level (logic "0") unless the oscillation frequency (FOSC) is matched to the selected FM channel. When FOSC is matched to the selected FM channel, STRONG is asserted as a high logic level (logic "1").

The RESET signal is used to reset (or initialize) the ramp generator at the beginning of the tuning cycle. In one example, RESET is momentarily asserted to a high logic level (logic "1") before beginning the tuning cycle.

The INV logic gate asserts the WEAK signal to a high logic level (logic "1") while FOSC is not matched to the selected FM channel. The AND logic gate sets the ENSW signal to a high logic level (logic "1") when the current mode is set to TUNE and received signal strength is indicated as WEAK. The ramp generator is enabled by the ENSW signal and will begin to produce a ramped control signal (SETF) while it is enabled. Although Ramp generator (360) is described as a ramping signal, another circuit that provides an increasing or decreasing signal may be used in place. For example, a stepped ramp signal that is stepped up (or down) in discrete levels, a linear ramp, and a non-linear ramp are within the scope and spirit of the present invention.

While ramp generator 360 is enabled (an not RESET) the tuning frequency of the tuned antenna is adjusted by SETF. As SETF varies, the oscillation frequency (FOSC) of RCV_IN will also vary. When the oscillation frequency (FOSC) is matched to the selected tuning frequency of FM receiver 340, the STRONG signal is asserted to a high logic level (logic "1") and ramp generator 360 is disabled from changing (ENSW is set to logic "0"). The STRONG signal is further received by the controller (not shown) to indicate that tuning is complete.

Receive Mode

In the receive mode, the TUNE signal is set to a low logic level (logic "0"), and the TRANSMIT signal is set to a low logic level (logic "0"). These signals cause the OR logic gate to set ENFB to a low signal level (logic "0"), which opens switch SW31. While switch SW31 is open, RCV_IN is isolated from FBIN and the oscillation feedback path previously described above is broken.

The receive mode will always occur after at least one tune mode operation such that tunable antenna 310 is already tuned to a frequency corresponding to the selected FM channel. RCV_IN is coupled to FM receiver 340. RCV_IN corresponds to FM carrier modulated signals that are in the selected FM channel. Thus, the output (FMOUT) of the FM receiver (340) corresponds to an FM stereo signal that was modulated at the selected FM channel frequency. Other electronic circuits and systems (not shown) may then process the FM stereo signal as may be necessary.

Transmit Mode

In the transmit mode, the TUNE signal is set to a low logic level (logic "0"), and the TRANSMIT signal is set to a high logic level (logic "1"). These signals cause the OR logic gate to set ENFB to a high signal level (logic "1"), which closes switch SW31. While switch SW31 is closed, RCV_IN is coupled to FBIN and the oscillation feedback path previously described above is active.

The transmit mode will always occur after at least one tune mode operation such that tunable antenna 310 is already tuned to a frequency corresponding to the selected FM channel. RCV_IN is coupled to FM receiver 340. RCV_IN corresponds to FM carrier modulated signals that are in the selected FM channel. Thus, the output (FMOUT) of the FM receiver (340) corresponds to an FM stereo signal that was modulated at the selected FM channel frequency.

Tuning adjustment circuit 370 is enabled when the TRANSMIT signal is asserted to a high logic level (logic "1"). The tuning adjustment circuit provides a portion of the SETF signal in response to FMOUT and TSIG when enabled. TSIG is provided to the tuning adjustment circuit by the other electronic circuits (not shown). TSIG corresponds to a signal that is to be transmitted.

The tuning adjustment circuit is arranged such that as TSIG changes over time, the output of the tuning adjustment signal (SETF) also changes. By changing the tuning adjustment signal (SETF), the oscillation frequency (FOSC) of the tuned antenna (310) also changes such that the transmission signal (TSIG) is effectively modulated in the RCV_IN signal. The tuning adjustment circuit (370) compares the FMOUT signal to the TSIG signals to determine when to increase or decrease the SETF signal.

Although the electronic systems and circuits are illustrated in FIG. 3 as individual blocks, the electronic system should not be interpreted as limited to these discrete blocks. One or more of the electronic system blocks may be combined or separated into one or more blocks that provide a similar functionality. For example, the tuning adjustment circuit (370) and the ramp generator (360) circuit may be combined into a single block that includes facility for both functions.

Example Tuned Antenna Circuit

FIG. 4 is a schematic diagram of an exemplary circuit (400) that includes a tunable antenna (410), an amplifier (420), a feedback circuit (430), and a ramp generator (440) that are in accordance with the present invention.

The tunable antenna (410) includes an antenna, and two capacitance circuits (C41, C42). The antenna is shown as a loop antenna that includes two terminals (ANT1, ANT2). However, any resonant antenna may be employed in place of the loop antenna and is considered within the scope of the present invention. Capacitance circuit C41 is a variable capacitance circuit that is coupled across antenna terminals ANT1 and ANT2. Capacitance circuit C42 is a fixed value capacitor that is coupled in parallel with capacitance circuit C41. Capacitance circuit C41 includes a control terminal that is coupled to FADJ. Antenna terminals ANT1 and ANT2 are coupled across the input terminals of amplifier 420.

The feedback circuit (430) includes a capacitance circuit (C43), an inverter (INV41) and two controlled switches (SW41, SW42). Switch SW41 has a first terminal that is coupled to a circuit ground potential (GND), a second terminal that is coupled to FB, and a control terminal that is coupled to DISFB. Switch SW42 has a first terminal that is coupled to RCV_IN, a second terminal that is coupled to FB, and a control terminal that is coupled to ENFB. Logic gate INV41 has an input terminal that is coupled to ENFB, and an output terminal that is coupled to DISFB. Capacitance circuit C43 has a first terminal that is coupled to FB, and a second terminal that is coupled to ANT1.

The ramp generator (440) includes a current source (IS), two controlled switches (SW43, SW44), and a capacitance circuit (C44). The current source is coupled between a power supply potential (VPWR) and SRC. Switch SW43 has a first terminal that is coupled to SRC, a second terminal that is coupled to FADJ, and a control terminal that is coupled to ENSW. Switch SW44 has a first terminal that is coupled to FADJ, a second terminal that is coupled to the circuit ground potential (GND), and a control terminal that is coupled to RESET. Capacitance circuit C44 has a first terminal that is coupled to FADJ, and a second terminal that is coupled to the circuit ground potential (GND).

Switch 43 is closed when the ENSW control signal is a high logic level (logic "1"), and opened when the ENSW control signal is a low logic level (logic "0"). Switch 44 is closed when the RESET control signal is a high logic level (logic "1"), and opened when the RESET control signal is a low logic level (logic "0"). The ramp generator (440) as shown is used to generate a control signal (FADJ) by driving a current (IS) into the capacitance circuit (C44) when switch SW43 is closed and switch SW44 is open. FADJ will be a linear voltage when the current (IS) is driven as a fixed current into a capacitance circuit having a fixed value. The rate of increase of the voltage will be determined as $(\partial V/\partial t) = IS/C$. RESET is used to periodically discharge the capacitance circuit to initialize the voltage ramp to a zeroed position.

In operation, the tuned antenna circuit (400) operates substantially similar to that described in FIG. 3. For example, the control signals ENSW, RESET, EN_FB, and RCV_IN are substantially the same as that described previously. When ENFB is a high logic value (logic "1"), switch SW42 is closed and SW41 is open. While switch SW42 is closed a feedback path is formed from RCV_IN to ANT1 through capacitance circuit C43. The capacitance circuit (C43) and the amplifier (420) are arranged to provide sufficient feedback to the antenna such that a resonant condition is formed and RCV_IN will oscillate at a tuned frequency (FOSC). Capacitance circuit C41 is controlled by FADJ to adjust the tuned frequency (FOSC). When the desired tuning frequency is achieved, switch SW43 is opened and capacitance circuit C44 maintains the current control signal FADJ. When feedback is disabled, switch SW42 is opened breaking the feedback path to the tunable antenna (410), and switch 41 is closed so that a constant impedance load is maintained on the antenna (capacitance circuit C43 is a constant load on ANT1).

Each of the capacitance circuits shown in FIG. 4 are representative of lumped capacitances. In implementation a combination of series and/or parallel capacitive elements may be employed. Also, the feedback capacitance circuit (C43) may be replaced by another feedback circuit that may include other components, included but not limited to, resistors, capacitors, inductors, diodes, varactor diodes, and other components that are arranged to provide appropriate feedback for tuned oscillation.

Procedural Flow

Figure 6:
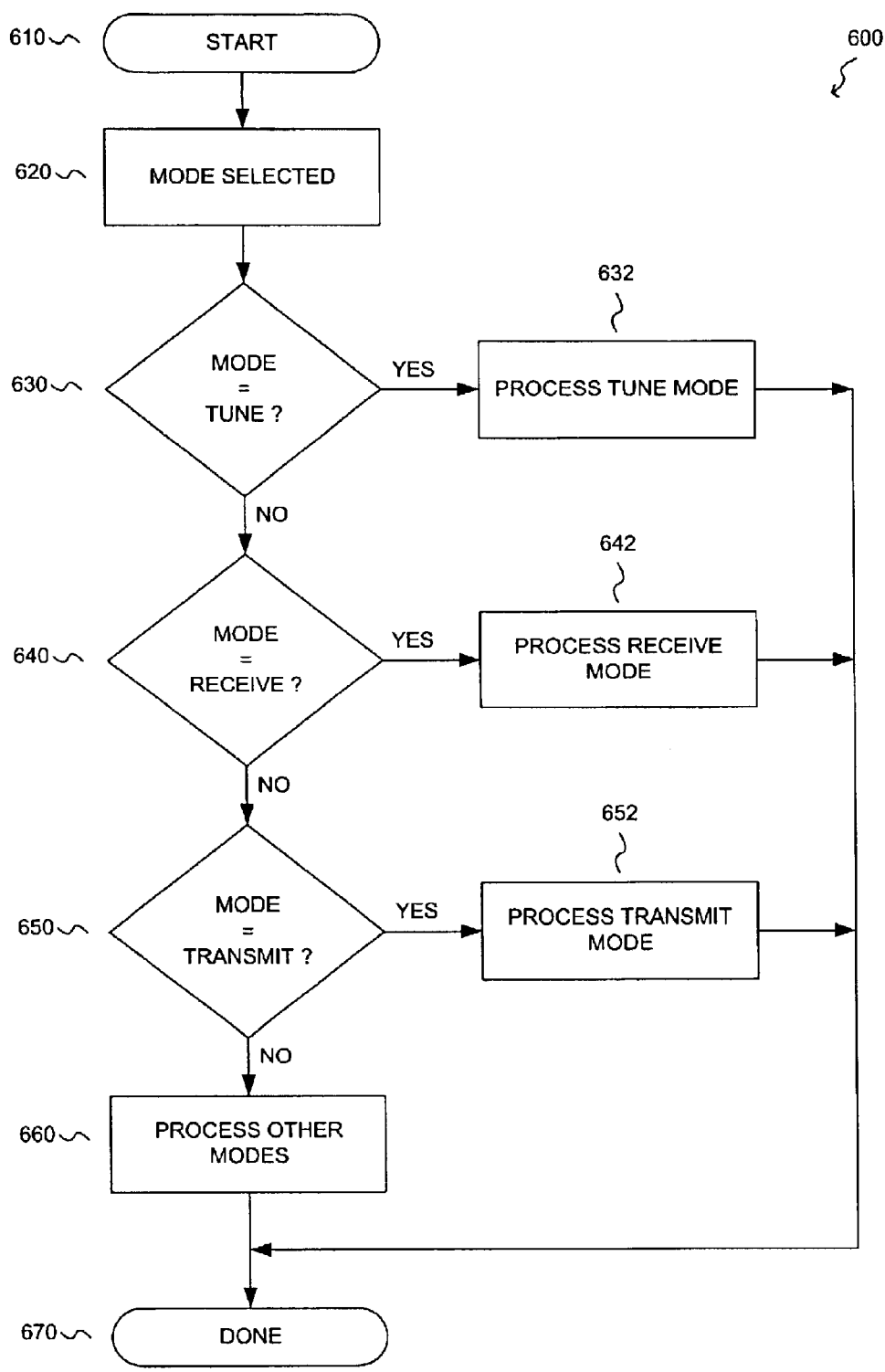
FIG. 6 is a flow chart illustrating a portion of an exemplary method for automatically tuning an antenna.

FIG. 6 is a flow diagram (600) illustrating an exemplary procedure that may be utilized by a controller to select the various operating modes for the automatically tuned antenna system (300) illustrated in FIG. 3. Starting at block 610 (START), processing proceeds to block 620.

At block 620 (MODE SELECT) an operating mode for the system is selected. The selected mode may be selected by a controller or some other automated process. In one example, a scheduler is utilized that may select a mode either periodically or at a designated time interval. In another example, a user can select a mode by some manual activation means. After a mode is selected, processing proceeds to decision block 630.

At decision block 630 (MODE=TUNE?), the selected mode is analyzed to determine if the tune mode has been selected. Processing flows to block 632 when the selected mode is a tune mode. At block 632 (PROCESS TUNE MODE), the tune mode is processed in accordance with the present invention. Upon completion of block 632, processing flows to block 670 (DONE) where processing is terminated. Processing flows from decision block 630 to decision block 640 when the selected mode is not the tune mode.

At decision block 640 (MODE=RECEIVE?), the selected mode is again analyzed. Processing flows to block 642 when the selected mode is a receive mode. At block 642 (PROCESS RECEIVE MODE), the receive mode is processed in accordance with the present invention. Upon completion of block 642, processing flows to block 670 (DONE) where processing is terminated. Processing flows from decision block 640 to decision block 650 when the selected mode is not the receive mode.

At decision block 650 (MODE=TRANSMIT?), the selected mode is once again analyzed. Processing flows to block 652 when the selected mode is a transmit mode. At block 652 (PROCESS TRANSMIT MODE), the transmit mode is processed in accordance with the present invention. Upon completion of block 652, processing flows to block 670 (DONE) where processing is terminated. Processing flows from decision block 650 to block 660 when the selected mode is not the transmit mode.

At block 660 (PROCESS OTHER MODES), other processing modes are handled. Some example processing modes may include, reaping old scheduled processes that have aged and need to be removed, powering down the system into a sleep mode, or some other process as may be desired. Processing then flows from block 660 to block 670 where processing is terminated.

Example Tune-Mode Operation

Figure 7:
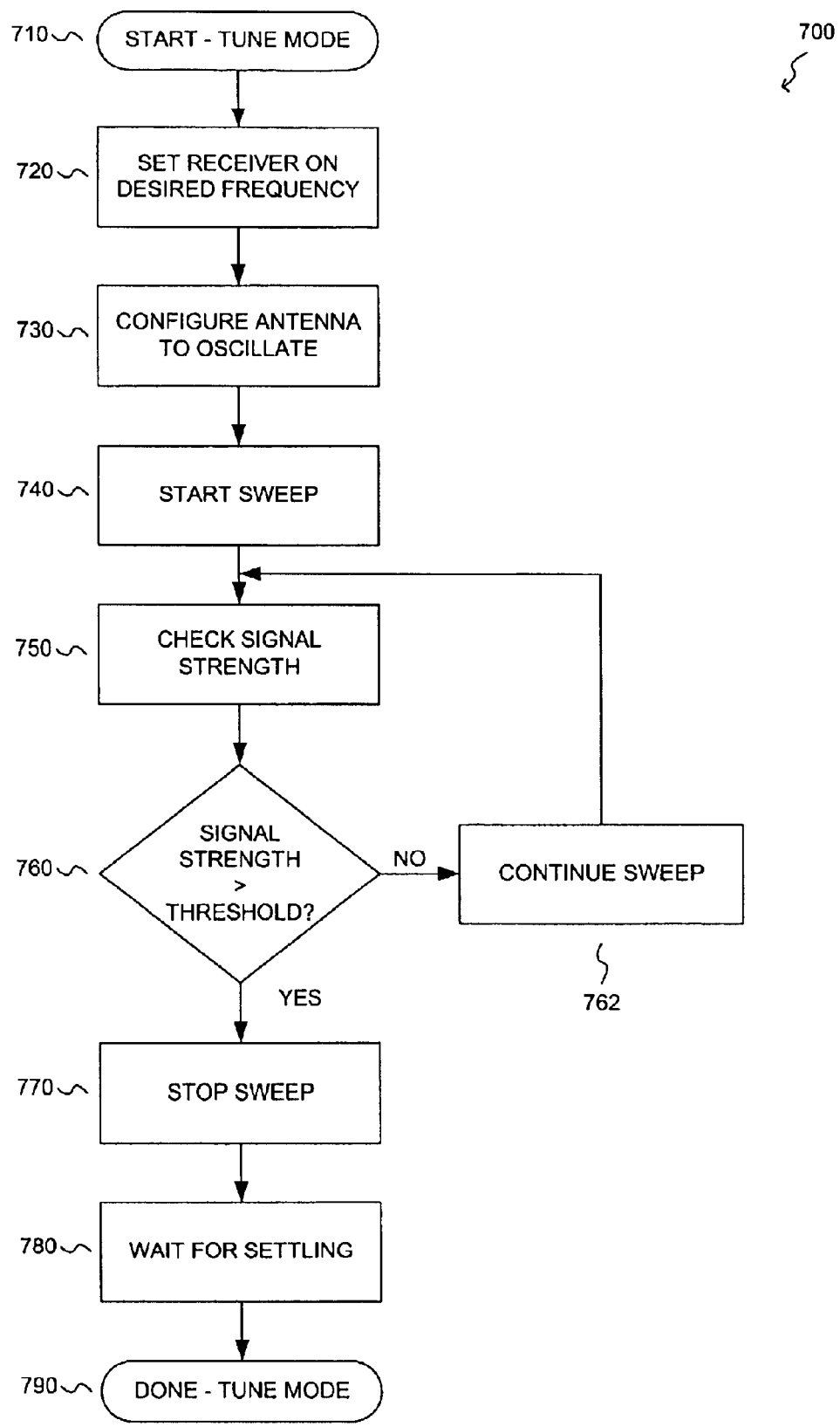
FIG. 7 is a flow chart illustrating another portion of an exemplary method for automatically tuning an antenna.

FIG. 7 is a flow diagram (700) illustrating an exemplary procedure that may be utilized to process the tune mode for the automatically tuned antenna system (300) illustrated in FIG. 3. Starting at block 710 (START), processing proceeds to block 720.

At block 720 (SET RECEIVER TO DESIRED FREQUENCY), the receiver (i.e. FM receiver 340) is tuned to a desired frequency (i.e. an FM channel). Processing then flows from block 720 to block 730.

At block 730 (CONFIGURE ANTENNA TO OSCILLATE) the antenna (i.e. tunable antenna 310) is configured to oscillate (i.e. feedback circuit 330 is activated by closing switch SW2). A sweep generator (such as shown in FIGS. 3 and 4) may also be initialized such that a frequency adjustment control signal (SETF) is set to zero or some other value. The antenna and the associated tuning elements (i.e., a varactor or tuned capacitor) will oscillate at a resonant frequency (FOSC) as determined by the output of the sweep generator. Processing then flows from block 730 to block 740.

At block 740 (START SWEEP) the sweep generator is enabled, and a control signal (SETF) begins to sweep across an operating range. Processing flows from block 740 to block 750.

At block 750 (CHECK SIGNAL STRENGTH) the received signal strength (SIG_STR) is evaluated. Processing flows from block 750 to decision block 760.

At block 760 (SIGNAL STRENGTH>THRESHOLD) the signal strength is compared to a predetermined threshold level. Processing flows from decision block 760 to block 762 when the signal strength is below the predetermined threshold. At block 762 (CONTINUE SWEEP) the control signal (SETF) continues to sweep, and processing continues to block 750. Processing flows from decision block 760 to block 770 when the signal strength exceeds the predetermine threshold.

At block 770 (STOP SWEEP), the sweep generator is disabled. The control signal (SETF) is held at the value where the signal strength exceeded the predetermined threshold. This indicates that the antenna has been tuned to the desired frequency. Processing then proceeds to block 780.

At block 780 (WAIT FOR SETTLING), where the system settles down from the transients associated with switching between tune and various other modes. A counter, an oscillator, a delay generator or some other circuit or process can be employed to wait a sufficient amount of time so that the system has settled. Processing then flows from block 780 to block 790 (DONE) where processing is terminated.

Example Receive-Mode Operation

Figure 8:
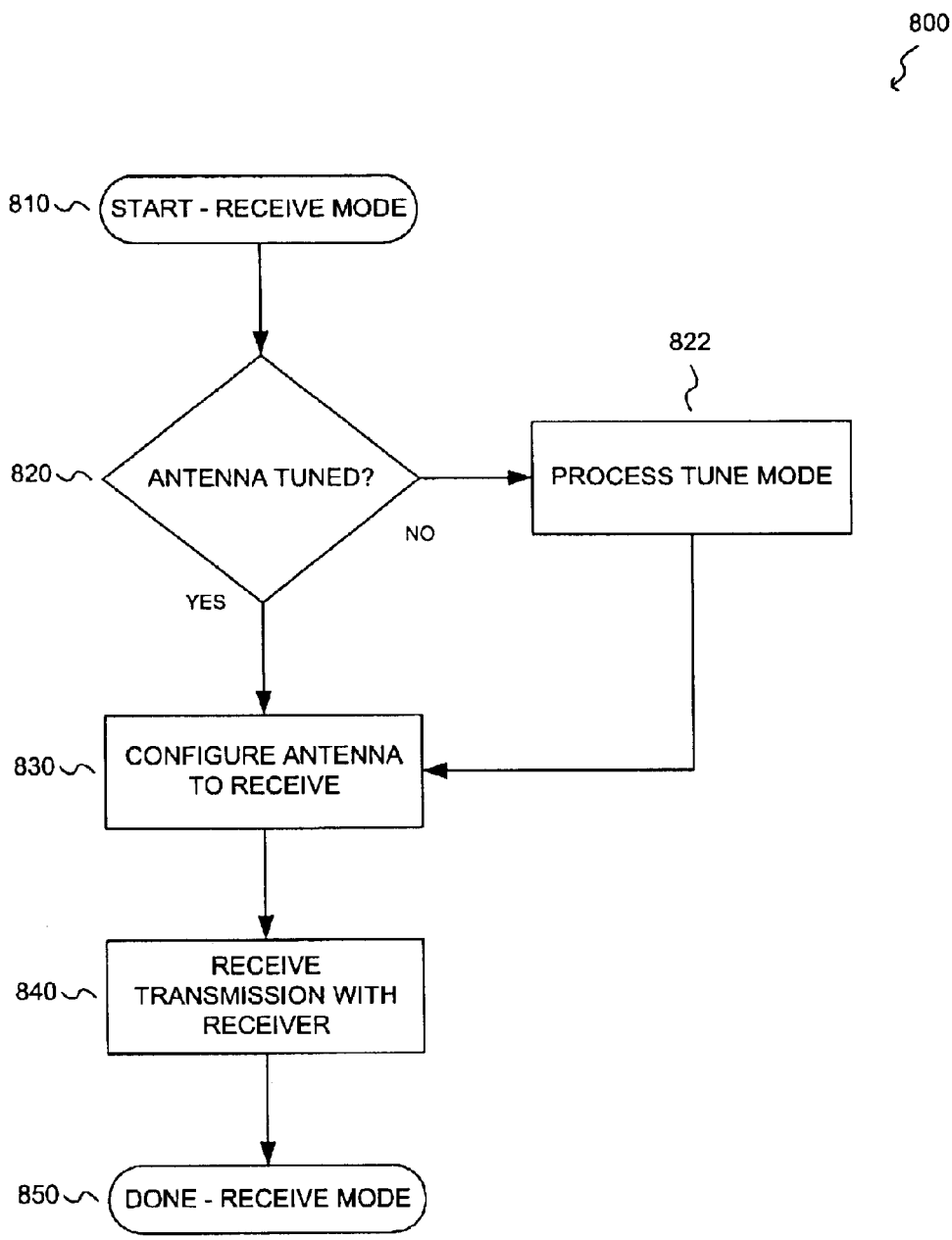
FIG. 8 is a flow chart illustrating yet another portion of an exemplary method for automatically tuning an antenna.

FIG. 8 is a flow diagram (800) illustrating an exemplary procedure that may be utilized to process the receive mode for the automatically tuned antenna system (300) illustrated in FIG. 3. Starting at block 810 (START), processing proceeds to decision block 820.

At decision block 820 (ANTENNA TUNED?), it is determined if the antenna is currently tuned to the proper receiver frequency (i.e. a particular FM channel). Processing flows from block 820 to block 822 when it is determined that the antenna is not currently tuned to the proper frequency. At block 822 (PROCESS TUNE MODE), the antenna is tuned to the desired frequency such as that described with reference to FIG. 7. Processing flows from bock 822 to block 830. Processing flows from block 820 to block 830 when it is determined that the antenna is already tuned to the proper frequency.

At block 830 (CONFIGURE ANTENNA TO RECEIVE), the antenna is arranged to operate in the receive mode. In the receive mode, the antenna is tuned to a particular frequency corresponding to a selected receiver channel, and the antenna is configured in a non-oscillating configuration as previously discussed with reference to FIG. 3. Processing flows from block 830 to block 840.

At block 840 (RECEIVE TRANSMISSION WITH RECEIVER), the receiver portion of the system receives a transmission that is modulated with a carrier frequency corresponding to the selected channel. In one example, the receiver is an FM receiver that has a stereo signal output that is received from the selected FM channel. After the transmission is received, processing flows from block 840 to block 850 (DONE), where processing is terminated.

Example Transmit-Mode Operation

Figure 9:
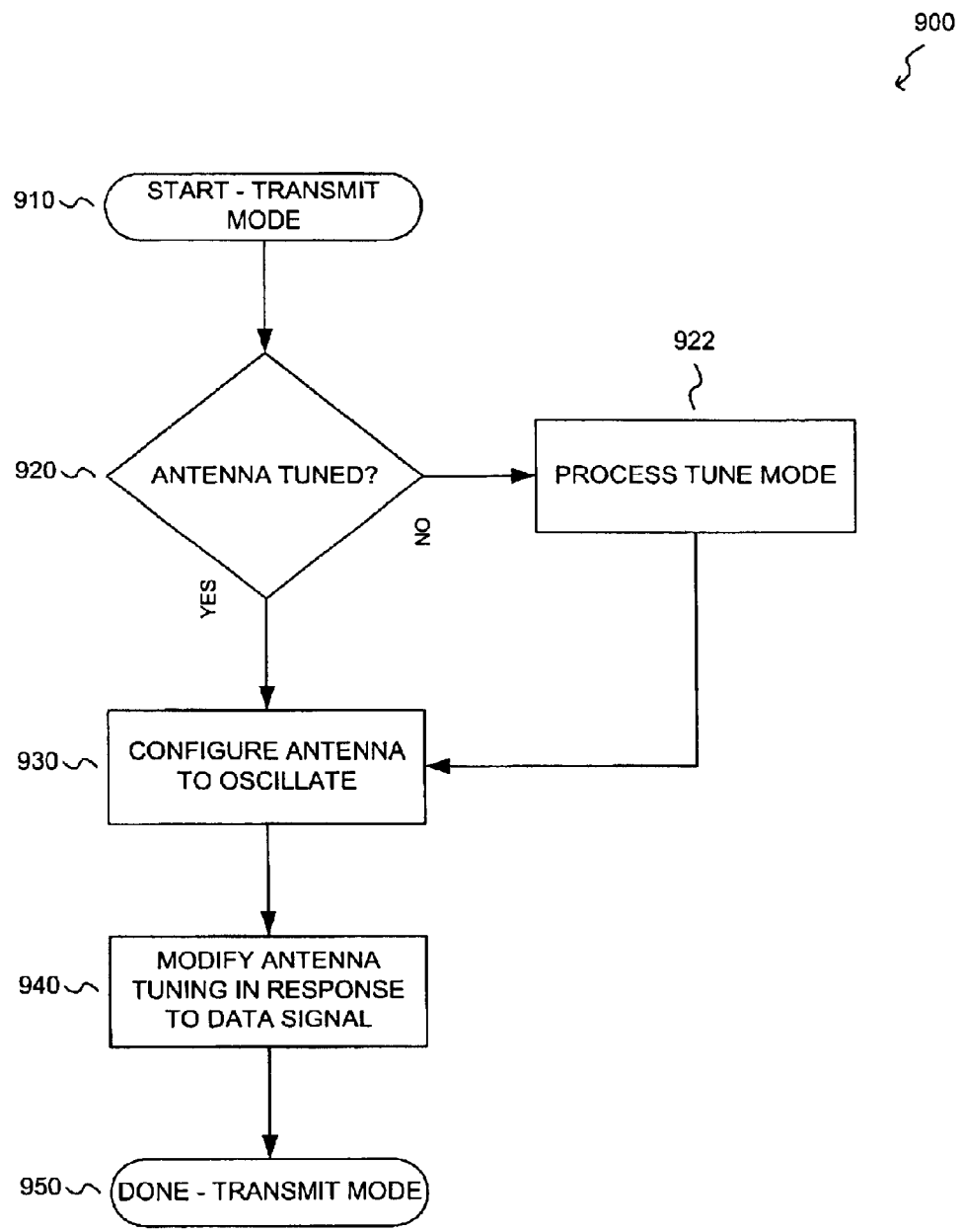
FIG. 9 is a flow chart illustrating still another portion of an exemplary method for automatically tuning an antenna.

FIG. 9 is a flow diagram (900) illustrating an exemplary procedure that may be utilized to process the transmit mode for the automatically tuned antenna system (300) illustrated in FIG. 3. Starting at block 910 (START), processing proceeds to decision block 920.

At decision block 920 (ANTENNA TUNED?), it is determined if the antenna is currently tuned to the proper receiver frequency (i.e. a particular FM channel). Processing flows from block 920 to block 922 when it is determined that the antenna is not currently tuned to the proper frequency. At block 922 (PROCESS TUNE MODE), the antenna is tuned to the desired frequency such as that described with reference to FIG. 7. Processing flows from bock 922 to block 930. Processing flows from block 920 to block 930 when it is determined that the antenna is already tuned to the proper frequency.

At block 930 (CONFIGURE ANTENNA TO OSCILLATE), the antenna is arranged to operate in the transmit mode. In the transmit mode, the antenna is initially tuned to a particular frequency in an oscillating configuration as previously discussed with reference to FIG. 3 (i.e. switch SW31 is closed). Processing flows from block 930 to block 940.

At block 940 (MODIFY ANTENNA TUNING IN RESPONSE TO DATA SIGNAL), the receiver portion of the system receives a transmission that is modulated with a carrier frequency corresponding to the selected channel. While the antenna is in the oscillation configuration power is being transmitted out into free space through the antenna. The transmission frequency corresponds to the oscillation frequency of the tuned antenna. Analog and/or digital information (hereinafter simply referred to as DATA) can be encoded into the transmission. Encoding into the transmission can be accomplished by shifting the frequency of the oscillator based on the DATA. Shifting may be accomplished by varying the tuning control signal to the tunable antenna. Thus the DATA may be encoded using frequency shift keying (FSK). After the transmission is complete, processing flows to block 950 (DONE), where processing is terminated.

Alternative Antenna Tuning System

FIG. 10 illustrates a portion of another illustrative automatically tuned antenna system (1000). The automatically tuned antenna system (1000) includes an antenna (1010), a selectable oscillator (1020), a tuning array (1030), a selectable comparator (1040), a counter (1050), a successive approximation register (1060), and an OR logic gate.

Antenna 1010 has two antenna terminals (A1, A2) that are coupled to nodes ANT1 and ANT2 respectively. Selectable oscillator 1020 includes bi-directional terminals (OSC1, OSC2) that are coupled to ANT1 and ANT2 respectively, and an input terminal (EN) that is coupled to ENOSC. Logic gate OR has an input terminal that is coupled to TUNE, another input terminal that is coupled to TRANSMIT, and an output terminal that is coupled to ENOSC. Tuning array 1030 includes a first bi-directional terminal (C1) that is coupled to ANT1, a second bi-directional terminal (C2) that is coupled to ANT2, and an input terminal (SEL) that is coupled to TSIG. Selectable comparator 1040 includes a first input terminal (IN1) that is coupled to ANT1, a second input terminal (IN2) that is coupled to ANT2, a third input terminal (EN) that is coupled to TUNE, and an output (CPO) that is coupled to CNTIN. Counter 1050 includes a first input terminal (IN) that is coupled to CNTIN, a second input terminal (LD) that is coupled to LOAD, a third input terminal (DB) that is coupled to FREQ, a fourth input terminal (RST) that is coupled to RESET, and an output terminal (COUT) that is coupled to CARRY. Successive approximation register (SAR) 1060 includes a first input terminal (CIN) that is coupled to CARRY, a second input terminal (RST) that is coupled to RESET, a third input terminal (EN) that is coupled to TUNE, a fourth input terminal (CLK) that is coupled to CLOCK, and an output terminal (SOUT) that is coupled to TSIG.

The tuning array (1030) is arranged to resonate with the antenna (1010) such that the antenna is tuned to a particular station frequency. The station frequency is selected via a set of tuning control signals that (TSIG). A receiver may also be coupled to ANT1 and ANT2 such that signals that are received from the tuned antenna are processed. For example, an amplifier such as an RF amplifier may be coupled to ANT1 and ANT2. The output of the RF amplifier may be coupled to an FM receiver. An example amplifier and receiver are coupled to ANT1 and ANT2 as previously illustrated in FIG. 3.

FIG. 11 illustrates an exemplary antenna tuning circuit (1100) that is compatible with the system illustrated in FIG. 10. Antenna tuning circuit (1100) includes an oscillator (1020), a tuning array (1030), and an antenna (1010).

The tuning array (1030) includes a decoder circuit (1110), an array of switching circuits (SW101–SW1XX), and an array of capacitors (C101–C1XX). Each of the switching circuits (e.g., SW101) is connected in series with an associated capacitor circuit (e.g., C101). Each series combination of the switching circuit and the capacitor circuit is coupled between the A1 and A2 terminals of the antenna (1010) at nodes ANT1 and ANT2, respectively. The decoder circuit (1110) is arranged to actuate the switching circuits in response to a selector signal such as a digital code that is provided by the tuning control signal (TSIG).

The oscillator (1020) includes seven transistors (M100–M106), a capacitor (C100), and a resistor (R100). Transistors M100 and M101 are arranged as a first inverter circuit, while transistors M102 and M103 are arranged as a second inverter circuit. The input of the first inverter is coupled to ANT1, while the input of the second inverter is coupled to ANT2. The output of the first inverter is coupled to ANT2, while the output of the second inverter is coupled to ANT1. The first and second inverters are current limited by a commonly shared current source, which corresponds to transistor M104. Transistor M105 is a diode-connected transistor that is series coupled to transistor M104 in a current reflector type of configuration. Transistor M105 is selectively coupled to VSS through resistor R100 when transistor M106 is active. Transistor M106 is arranged to operate a witch that is responsive to the enable signal (EN). The cross-coupled inverters in the oscillator drive the current to the selected capacitors from the array to initiate oscillations.

FIG. 12 illustrates an exemplary transmission system (1200) that is compatible with the antenna tuning system that is shown in FIG. 10. The transmission system (1200) includes an antenna (1010), a selectable oscillator (1020), a tuning array (1030), a modulation tuner (1210), a phase detector (1220), an IF oscillator (1230), and a digital-to-analog converter (DAC, 1240).

Antenna 1010 has two antenna terminals (A1, A2) that are coupled to nodes ANT1 and ANT2, respectively. Selectable oscillator 1020 includes bi-directional terminals (OSC1, OSC2) that are coupled to ANT1 and ANT2 respectively, and an input terminal (EN) that is coupled to ENOSC. Logic gate OR has an input terminal that is coupled to TUNE, another input terminal that is coupled to TRANSMIT, and an output terminal that is coupled to ENOSC. Tuning array 1030 includes a first bi-directional terminal (C1) that is coupled to ANT1, a second bi-directional terminal (C2) that is coupled to ANT2, and an input terminal (SEL) that is coupled to TSIG. Modulation tuner 1210 includes a first bi-directional input terminal (C1) that is coupled to ANT1, a second bi-directional input terminal (C2) that is coupled to ANT2, and an input terminal (CTL) that is coupled to MCTL. Phase detector 1320 includes a first input terminal (INA1) that is coupled to ANT1, a second input terminal INA2) that is coupled to ANT2, a third input terminal (INB1) that is coupled to IF1, a fourth input terminal (INB2) that is coupled to IF2, and an output (CTL) that is coupled to MCTL. IF oscillator 1230 includes an input terminal (FCTL) that is coupled to DSIG, a second input terminal (LO) that is coupled to IFO, a first output terminal (OSC1) that is coupled to IF1, and a second output terminal (OSC2) that is coupled to IF2. DAC 1340 includes an input terminal (IN) that is coupled to DATA, and an output terminal (OUT) that is coupled to (DSIG).

Although the electronic systems and circuits illustrated in FIGS. 10–12 are illustrated as individual blocks, the electronic system should not be interpreted as limited to these discrete blocks. One or more of the electronic system blocks may be combined or separated into one or more blocks that provide a similar functionality. For example, the tuning array (1030) and the modulation tuner (1210) may be combined into a single block that includes facility for both functions. In another example, the IF oscillator (1230) is a part of the receiver system.

The antenna tuning system illustrated by FIGS. 10–13 is configured to operate in up to three operating modes. The first operating mode is a tune mode. The second operating mode is a receive mode. The third operating mode is a transmit mode. For systems where the transmit mode is undesirable, electronics from FIG. 12 may be eliminated. For example, the modulation tuner (1210), phase detector (1220), IF oscillator (1230), and the DAC (1240) are unnecessary when the system does not require a transmit mode.

In operation, additional electronics (not shown) are used to provide control signals (TUNE, TRANSMIT, LOAD, FREQ, RESET, and CLOCK). The additional electronics (not shown) may include any appropriate controller such as a microprocessor, a micro-controller, a logic array, a state-machine, or another circuit that is arranged to selectively change the control signals.

The basic operation of the various modes will be described as follows below.

Alternative System Tuning Mode

In the tuning mode, the TUNE signal is set to a high logic level (logic "1"), and the TRANSMIT signal is set to a low logic level (logic "0"). These signals cause the OR logic gate to set ENOSC to a high signal level (logic "1"), which activates the oscillator (1020). Comparator 1040 and SAR 1060 are enabled by the TUNE signal.

The tuning array (1030) and the antenna (1010) cooperate with one another to form a tuned antenna circuit that resonates. Oscillator 1020 is arranged to excite the tuned antenna circuit such that the antenna oscillation signal increases in magnitude. Comparator 1040 receives the antenna oscillation signals from ANT1 and ANT2 and provides a comparator output to CNTIN. The comparator (1040) output is similar to a clock signal that operates at a frequency that corresponds to the antenna oscillation signal.

The counter is initialized at the start of each cycle of the tuning procedure in response to the LOAD signal. The preloaded count corresponds to a particular station frequency (FREQ). The output of comparator 1040 drives the input of counter 1050 such that the overall count increases with each successive cycle of the antenna oscillation signals. A carry out signal is provided to CNTIN when counter 1050 reaches an overflow condition.

SAR 1060 is reset (via RESET) at the beginning of the tuning procedure such that the tuning setting (TUNE) associated with the tuning array is initialized to a default tuning. While SAR 1060 is enabled, the SAR evaluates a carry in signal (CNTIN) from counter 1050 in response to the clock signal (CLOCK). Each time the carry in signal is evaluated, the SAR will select or deselect various tuning elements in the tuning array. The SAR and the tuning array each have a predetermined bit resolution (e.g., N). The number of cycles required in the tuning procedure corresponds to N.

Alternative System Receive Mode

In the receive mode, the TUNE signal is set to a low logic level (logic "0"), and the TRANSMIT signal is set to a low logic level (logic "0"). These signals cause the OR logic gate to set ENOSC to a low signal level (logic "0"), which disabled oscillator 1020. Comparator 1040 and SAR 1060 are disabled by the TUNE signal. The counter is inactive, since the comparator output is disabled.

The receive mode will always occur after at least one tune mode operation such that tunable antenna 1010 is already tuned to a frequency corresponding to the selected FM channel or station. ANT1 and ANT2 are coupled to an RF amplifier (e.g. Amplifier 320) that provides a RCV_IN signal to an FM receiver (e.g., 340) such as that shown in FIG. 2. RCV_IN corresponds to FM carrier modulated signals that are in the selected FM channel. Thus, the output (FMOUT) of the FM receiver (340) corresponds to an FM stereo signal that was modulated at the selected FM channel frequency. Other electronic circuits and systems (not shown) may then process the FM stereo signal as may be necessary.

Alternative System Transmit Mode

In the transmit mode, the TUNE signal is set to a low logic level (logic "0"), and the TRANSMIT signal is set to a high logic level (logic "1"). These signals cause the OR logic gate to set ENOSC to a high signal level (logic "1"), which enabled oscillator 1020. Comparator 1040 and SAR 1060 are disabled by the TUNE signal. Since comparator 1040 is disabled, counter 1040 has no effect. The transmit mode will always occur after at least one tune mode operation such that the antenna (1010) is tuned a desired station frequency via the tuning array (1030).

The transmission system (1200) is activated by the TRANSMIT signal such that the oscillator (1020) is active. While the oscillator is active, the oscillator cooperates with the tuning array (1030) and the modulation tuner (1210) to form an antenna tuning circuit. The antenna (1010) transmits energy that is supplied by the oscillator. In one example, the transmitted energy corresponds to an FM modulated signal that has a station frequency that is selected by the tuning array (1030). The modulation tuner is configured to provide frequency modulations that are centered on the station frequency. The phase detector (1220) is arranged to provide a modulation control signal (MCTL) to the modulation tuner. The tuning array is responsive to the tuning control signal that was discussed previously with respect to FIGS. 10 and 11. The phase detector is configured to provide the modulation control signal (MCTL) in response to a comparison between the phases of the antenna oscillator output (ANT1, ANT2) and the IF oscillator output (IF1, IF2). The IF oscillator (1230) is configured to provide the IF oscillator output (IF1, IF2) in response to a local oscillator signal (IFO), and a data signal (DOUT). The IF oscillator output is an oscillation signal that is centered on the local oscillator frequency (e.g., 3.1 MHz), where the frequency variations are determined by the DAC output signal (DSIG) such that the local oscillator is frequency modulated. DAC 1240 is configured to provide a DAC output signal (DISG) in response to a data signal (DATA), where the DAC output signal (DSIG) corresponds to a digital-to-analog conversion of the data signal (DATA).

Alternative System Procedural Flow

The procedural process flow for the alternative system operation is the same as that described previously with respect to FIG. 6. See previous discussion for further details.

Alternative System Procedural Operation for Tuning

Figure 13:
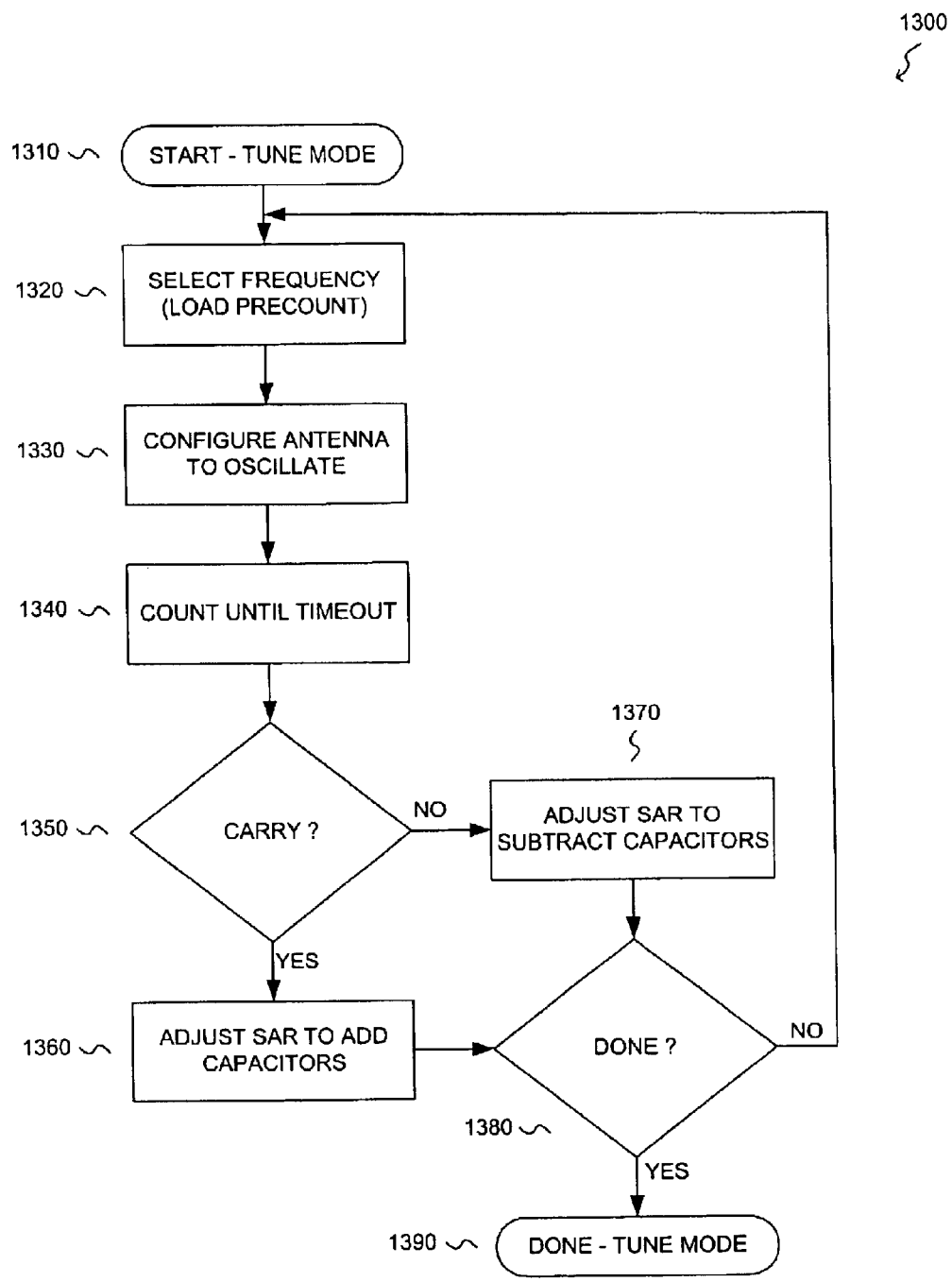
FIG. 13 is a flow diagram illustrating an exemplary procedure that may be utilized to process the tune mode for the transmission system that is illustrated in FIG. 12.

FIG. 13 is a flow diagram (1300) illustrating an exemplary procedure that may be utilized to process the tune mode for the transmission system (1200) that is illustrated in FIG. 12. Starting at block 1310 (START), processing proceeds to block 1320.

At block 1320 (SELECT FREQUENCY), the SAR is reset to initialize the tuning array to a default condition, and the counter is preloaded with a count that corresponds to a desired station frequency (or FM channel). Processing then flows from block 1320 to block 1330.

At block 1330 (CONFIGURE ANTENNA TO OSCILLATE) the antenna (e.g. antenna 1010) is configured to oscillate with the tuning array (1030) and the oscillator (1020), which is enabled. The antenna (1010) and the associated tuning elements (i.e., a varactor or tuned capacitor within the tuning array) will oscillate at a resonant frequency (FOSC) as determined by the tuning control signal (TSIG) from SAR 1060. Processing then flows from block 1330 to block 1340.

At block 1340 (COUNT UNTIL TIMEOUT) the counter is configured to count each transition on the output of the comparator (CNTIN). The carryout signal (CARRY) will transition from one logic state to another when the counter has achieved its full count. The counter will continue to count until a timeout condition occurs. The timeout condition corresponds to the clock period associated with SAR 1060. Processing flows from block 1340 to decision block 1350.

At decision block 1350 (CARRY?), the SAR (1060) evaluates the carryout signal (CARRY) to determine if the counter (1050) has reached a full count condition (or overflow). The carryout signal indicates whether current oscillation frequency is greater than or less to the desired station frequency, which is associated with the counter preload. The SAR (1060) is arranged to evaluate the carryout signal (CARRY) once per clock period. Processing continues from decision block 1350 to block 1360 when the carryout signal (CARRY) is one logic level (e.g., logic 1), and alternatively to block 1370 when the carryout signal (CARRY) is another logic level (e.g., logic 0).

At block 1360 (ADJUST SAR TO ADD CAPACITORS) the SAR (1060) processes the carryout signal (CARRY), and adjusts the tuning control signal (TSIG) to activate (or selectively couple) additional capacitors in the tuning array (1030) such that the antenna oscillation frequency is reduced. Processing flows from block 1360 to decision block 1380.

At block 1370 (ADJUST SAR TO SUBTRACT CAPACITORS) the SAR (1060) processes the carryout signal (CARRY), and adjusts the tuning control signal (TSIG) to deactivate (or selectively decouple) capacitors from the tuning array (1030) such that the antenna oscillation frequency is increased. Processing flows from block 1370 to decision block 1380.

At decision block 1380 (DONE?), the system evaluates the current tuning cycle number to determine when the tuning process is complete. For example, when a 10bit SAR is used, 10 cycles of the SAR is necessary to complete a tuning procedure. The bit resolution of SAR 1060 is matched to the tuning array (1030). Processing continues from decision block 1380 to block 1320 when additional tuning cycles are required. Otherwise, processing continues from decision block 1380 to termination block (DONE) 1390, where processing is terminated when all tuning cycles are completed.

Alternative System Procedural Operation for Receiving

The procedural operation for receiving with the alternative tuning system illustrated in FIGS. 10–12 is the same as that previously discussed with respect to FIG. 8. See previous discussion for details.

Alternative System Procedural Operation for Transmitting

The procedural operation for transmitting with the alternative tuning system illustrated in FIGS. 10–12 is the same as that previously discussed with respect to FIG. 9. See previous discussion for details.

Figure 14:
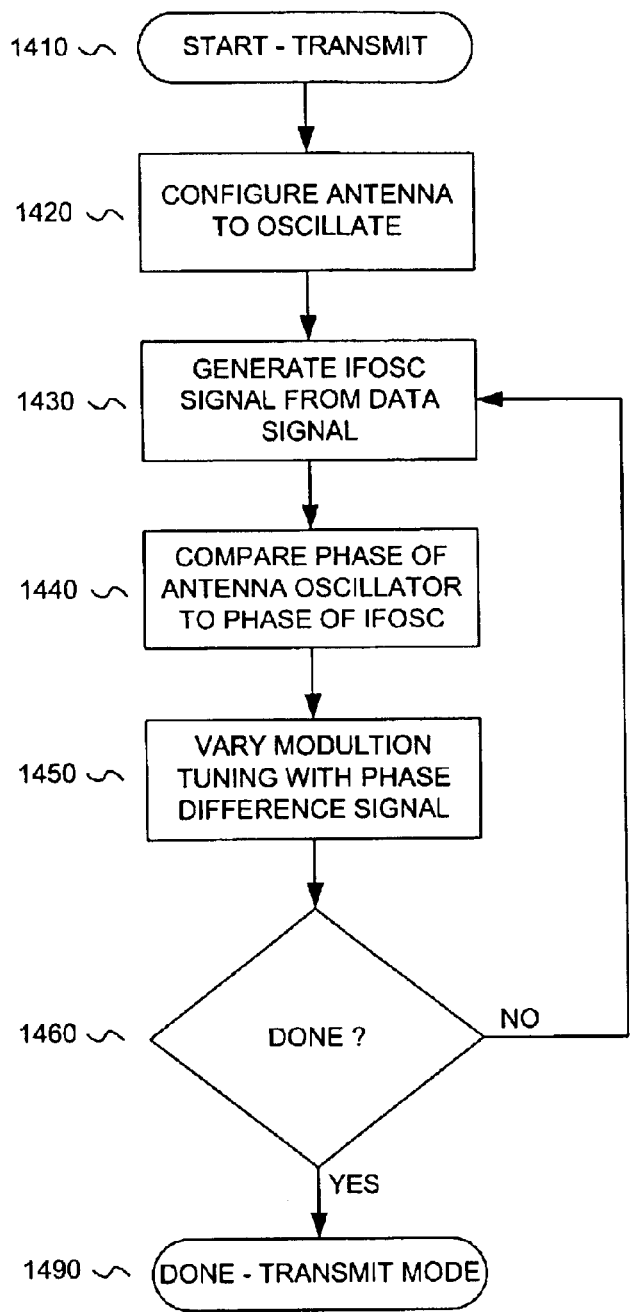
FIG. 14 is a flow diagram illustrating a detailed exemplary procedure that may be utilized to process the transmit mode for the alternative antenna tuning system that is illustrated in FIG. 12, in accordance with the present invention.

FIG. 14 is a flow diagram (1400) illustrating a detailed exemplary procedure that may be utilized to process the transmit mode for the alternative antenna tuning system (1200) that is illustrated in FIG. 12. Starting at block 1410 (START), processing proceeds to block 1420.

At block 1420 (CONFIGURE ANTENNA TO OSCILLATE) the antenna is configured to oscillate. In one example, antenna 1010 is coupled to tuning array 1030, modulation tuner 1210, and oscillator 1020 (which is enabled). The antenna (1010) and the associated tuning elements (i.e., varactors or tuned capacitors within the tuning array and the modulation tuner) will oscillate at a resonant frequency (FOSC) as determined by the tuning control signal (TSIG) from SAR 1060 and the modulation control signal (MCTL) from the phase detector (1220). Since the tuning array is already adjusted for a desired station frequency (see previous discussion), FOSC should be centered on the station frequency. Processing then flows from block 1420 to block 1430

At block 1430 (GENERATE IFOSC SIGNAL FROM DATA SIGNAL), an IF oscillator signal is generated in response to a data signal. In one example, the IF oscillator (1230) is configured to provide an IF oscillator signal (IF1, IF2). The IF oscillator signal is centered on a local oscillator signal, such as a 3.1 MHz signal. The IF oscillator (1230) modulates the local oscillator signal (IFO) in response to a data signal such as that provided by DAC 1240. Processing continues from block 1430 to block 1440.

At block 1440 (COMPARE PHASE OF ANTENNA OSCILLATOR TO PHASE OF IFOSC), the phase of the antenna oscillator is compared to the phase of the IF oscillator signal. In one example, the phase of the oscillators is compared via phase detector 1220, which provides a modulation control signal (MTL) to modulation tuner 1210. Processing continues to block 1450.

At block 1450 (VARY MODULATION TUNING WITH PHASE DIFFERNCE SIGNAL), the modulation tuning is varied in response to the phase difference signal, where the phase difference signal corresponds to the difference between the phase of the antenna oscillator and the IF oscillator. In one example, phase detector 1220 provides the phase difference signal (MCTL) to modulation tuner 1210 such that the frequency of the antenna oscillator (FOSC) is varied. The Modulation tuner (1210) may be comprised of a capacitor array, a varactor, or some other selectable tuning element that resonates with the antenna. Processing continues from block 1450 to decision block 1460.

At block 1460 (DONE?), the system determines if the entire transmission sequence is complete. Processing continues from decision block 1460 to block 1430 when additional transmissions are necessary. Alternatively, processing continues from decision block 1460 to termination block 1490, when no additional transmissions are required.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

We claim:

1. An apparatus that includes an antenna that is automatically tuned, the apparatus comprising:
    a tuned circuit that includes the antenna and an adjustable tuning circuit, wherein the tuned circuit has a resonant frequency that is adjustable with a control signal;
    an amplifier circuit that is arranged to provide an output signal in response to an input signal that is received from the tuned circuit;
    a feedback circuit that is arranged to selectively couple at least a portion of the output signal to the tuned circuit such that the tuned circuit, amplifier circuit, and feedback circuit operate as an oscillator that oscillates at the resonant frequency when the feedback circuit is active;
    a receiver circuit that is tuned to a selected frequency is arranged to receive the output signal and to provide an indicator signal, wherein the indicator signal indicates a signal level of signals received at the selected frequency; and
    a tuning adjustment circuit that is arranged to selectively provide the control signal such that the control signal is adjusted until the signal level of the indicator signal exceeds a predetermined threshold, wherein the signal level of the indicator signal exceeds the predetermined threshold when the resonant frequency of the tuned circuit is matched to the selected frequency of the receiver.

2. An apparatus as in claim 1, the tuning adjustment circuit further comprising a ramp generator that is arranged to provide the control signal, wherein the ramp generator adjusts the control signal from a start value to an end value when active, and the control signal is effective to adjust the resonant frequency of the tuned circuit over the operating range of the receiver.

3. An apparatus as in claim 2, wherein the ramp generator adjusts the control signal in at least one of identical discrete steps, non-identical discrete steps, a linear contiguous ramp, a non-linear contiguous ramp, and discrete predetermined levels.

4. An apparatus as in claim 1, the tuning adjustment circuit further comprising a discriminator circuit that is arranged to provide an enable signal when the signal level of the indicator signal is below the predetermined threshold, wherein the tuning adjustment circuit varies the control signal when the enable signal is a first logic level, and the tuning adjustment circuit maintains the control signal when the enable signal is a second logic level that is different from the first logic level.

5. An apparatus as in claim 1, wherein the adjustable tuning circuit is a variable capacitance circuit that includes at least one of a capacitor, a varactor diode, and an electronic circuit that is arranged to operate as a variable capacitance.

6. An apparatus as in claim 1, the feedback circuit further comprising a capacitance circuit and a switching circuit, wherein the capacitance circuit is arranged to couple the at least a portion of the output signal to the tuned circuit when the switching circuit is in a closed position, and the resonant frequency of the tuned circuit does not change when the switching circuit is in an open position.

7. An apparatus as in claim 1, wherein the feedback circuit is active and the tuning adjustment circuit is arranged to adjust the control signal in response to an information signal when the apparatus is in a transmit mode such that the resonant frequency of the tuned circuit is adjusted in response to the information signal and the antenna transmits a transmission signal corresponding to the information signal.

8. An apparatus as in claim 1, wherein the feedback circuit is active when the apparatus is in a tune mode, and the feedback circuit is inactive when the apparatus is in a receive mode.

9. An apparatus as in claim 8, wherein the receiver is arranged to provide a demodulated signal when the receiver is in the receive mode, the demodulated signal corresponding to an information signal that is received by the antenna as a modulated signal that is modulated at the selected frequency.

10. A method for automatically tuning an antenna, comprising:
    selecting a desired frequency;
    initializing a control signal to a start value at the beginning of the tune mode, the start value corresponding to a frequency at one end of the operating spectrum of the wireless system;
    arranging the antenna to oscillate at a resonant frequency with a tuning circuit, the tuning circuit having an adjustable tuning element that is arranged to adjust the resonant frequency in response to the control signal;
    determining a signal strength of the output signal at a selected frequency, the output signal in cooperation of the antenna and tuning circuit;
    changing the control signal to another value when the signal strength is below a predetermined threshold level; and
    maintaining the control signal when the signal strength is above the predetermined threshold level, whereby the resonant frequency is substantially the same as the selected frequency when the signal strength is above the predetermined threshold level such that the antenna is tuned.

11. A method as in claim 10, changing the control signal to another value further comprising at least one of sweeping the control signal in a linear manner, sweeping the control signal in a non-linear manner, changing the control signal by discrete steps of equal size, and changing the control signal to predetermined discrete values.

12. A method as in claim 10, arranging the antenna to oscillate further comprising:
    coupling the antenna to the tuning circuit, the antenna and the tuning circuit forming a tuned antenna circuit that has a resonant frequency;
    coupling an output of the tuned antenna circuit to an input of an amplifier circuit; and
    coupling an output of the amplifier circuit to the tuned antenna circuit such that the tuned antenna circuit oscillates at the resonant frequency.

13. A method for using a tuned antenna, comprising:
    arranging an antenna with a tuning circuit, the antenna and the tuning circuit forming a tuned antenna circuit that has a resonant frequency;
    selecting an operating mode and a desired frequency;
    coupling the tuned antenna circuit to an amplifier circuit when the operating mode is a tune mode such that the tuned antenna circuit oscillates at the resonant frequency;
    sweeping the resonant frequency over a range of values when the operating mode is the tune mode and the resonant frequency is substantially different from the desired frequency; and
    stopping the sweep when the resonant frequency is substantially the same as the desired frequency and the operating mode is the tune mode.

14. A method as in claim 13, further comprising:
    coupling the tuned antenna circuit to an amplifier circuit when the operating mode is a transmit mode such that the tuned antenna circuit oscillates at the resonant frequency; and
    shifting the resonant frequency in response to an information signal such that the antenna transmits frequency shift keyed signals corresponding to the information signal when the operating mode is the transmit mode.

15. A method as in claim 13, further comprising:
    disconnecting feedback between the tuned antenna circuit and the amplifier circuit when the operating mode is a receive mode; and
    receiving a transmission signal with the tuned antenna circuit, wherein the transmission signal is an information signal that is transmitted on a carrier signal at the selected frequency.

16. A wireless watch device including an antenna that is automatically tuned to a selected frequency, comprising:
    a means for tuning that is coupled to the antenna such that the antenna and the means for tuning have a resonant frequency;
    a means for amplifying that is arranged to provide an output signal in response to an input signal from the antenna;
    a means for oscillating that is arranged to provide feedback of the output signal to the antenna such that the antenna and the means for tuning oscillate at the resonant frequency when selected;

a means for receiving that is arranged to receive the output signal and provide a signal strength that indicates a level of the output signal that is tuned to the selected frequency;

a means for discriminating that is arranged to activate an enable signal when the signal strength is substantially below a predetermined threshold, and the enable signal is deactivated when the signal strength reaches or exceeds the predetermined threshold; and a means for adjusting that is arranged to adjust the resonant frequency of the means for tuning when the enable signal is active such that the resonant frequency is adjusted until tuned to the selected frequency.

17. An apparatus that includes an antenna that is automatically tuned, the apparatus comprising:
   a tuned circuit that includes the antenna and a tuning array, wherein the tuned circuit has a resonant frequency that is associated with a tuning control signal that is provided to the tuning array;
   an oscillator circuit that is coupled to the tuned circuit such that the tuned circuit and the oscillator circuit form a resonant circuit that provides an antenna oscillation signal that oscillates at the resonant frequency when the oscillator circuit is enabled;
   a comparator circuit that is coupled to the tuned circuit such that the comparator circuit produces a comparator output signal in response to the antenna oscillation signal when the comparator circuit is enabled;
   a counter circuit that is coupled to the comparator circuit such that the counter detects a number of oscillations associated with the comparator output signal during a time interval; and
   a successive approximation register that is arranged to provide the tuning control signal, wherein the tuning control signal is adjusted in response to a carryout signal from the counter at the end of the time interval when the successive approximation register is enabled.

18. The apparatus of claim 17, the tuning array further comprising: a decoder circuit that is arranged to provide an array of selection control signals, and an array of selectable capacitor circuits that are each selected in response to an associated one of the selection control signals, wherein each of the selectable capacitor circuits is coupled to the antenna such that the antenna and the selected capacitor circuits form the tuned circuit.

19. The apparatus of claim 17, wherein the counter circuit is arranged to preload a specified count before each time interval, wherein the specified count is associated with a selected station frequency.

20. The apparatus of claim 17, wherein the counter circuit is arranged to preload a specified count before each time interval, wherein the specified count is associated with a selected station frequency, and wherein the counter circuit is also arranged to provide the carryout signal to the successive approximation register when the number of oscillations exceeds the specified count at the end of the time interval.

21. The apparatus of claim 17, wherein the oscillator circuit, the comparator circuit, and the successive approximation register are enabled when a tuning mode is selected in the apparatus.

22. The apparatus of claim 17, wherein the oscillator circuit is enabled when a transmit mode is selected in the apparatus.

23. A method for automatically tuning an antenna, comprising:
   selecting a desired frequency;
   initializing a tuning control signal to an initial value at the beginning of the tuning mode, the initial value corresponding to a frequency at one end of the operating spectrum;
   configuring the antenna to oscillate such that the antenna provides an oscillator signal with an associated resonant frequency, wherein the resonant frequency is related to the tuning control signal;
   initiating tuning cycles when the tune mode is active, wherein each tuning cycle includes:
      counting a number of oscillations in the oscillator signal over the predetermined time interval; and
      adjusting the tuning control signal in response to the number of oscillations counted over the predetermined time interval.

24. The method of claim 23, wherein each tuning cycle further comprises: adjusting the tuning control signal to increase the resonant frequency when the number of oscillations counted over the predetermined time interval exceeds a predetermined amount, and adjusting the tuning control signal to decreases the resonant frequency when the number of oscillations counted over the predetermined time interval is below the predetermined amount.

25. The method of claim 23, further comprising coupling additional capacitors to the antenna in response to the tuning control signals when the number of oscillations counted over the predetermined time interval exceed a predetermined amount, and decoupling capacitors from the antenna in response to the tuning control signals when the number of oscillations counted over the predetermined time interval is below the predetermined amount.

26. A method for using an antenna, comprising:
   coupling the antenna to a tuning array such that the antenna and the tuning array form a tuned circuit that has a resonant frequency;
   selecting an operating mode and a desired frequency;
   activating an oscillator circuit when the operating mode is a tune mode, wherein the oscillator circuit excites the tuned circuit such that the tuned circuit oscillates at the resonant frequency;
   adjusting the resonant frequency when the operating mode is the tune mode and the resonant frequency is substantially different from the desired frequency, wherein adjusting the resonant frequency includes:
      counting a number of oscillations in the tuned circuit over a time interval;
      activating additional elements in the tuning array when the number of oscillations in the tuned circuit is above a predetermined amount at the end of the time interval; and
      deactivating elements in the tuning array when the number of oscillations in the tuned circuit is below the predetermined amount at the end of the time interval.

27. The method of claim 26, further comprising receiving a transmission signal with the tuned circuit when the selected operating mode corresponds to a receive mode, wherein the transmission signal is an information signal that is transmitted on a carrier signal at the selected frequency.

28. A method as in claim 26, further comprising: activating the oscillator circuit when the operating mode is a transmit mode, wherein the oscillator circuit excites the tuned circuit such that the tuned circuit oscillates at the resonant frequency, and shifting the resonant frequency in response to an information signal such that the antenna transmits frequency shift keyed signals corresponding to the information signal when the operating mode is the transmit mode.

29. A method as in claim 26, further comprising: activating the oscillator circuit when the operating mode is a transmit mode, wherein the oscillator circuit excites the tuned circuit such that the tuned circuit oscillates at the resonant frequency, and shifting the resonant frequency in response to an information signal such that the antenna transmits frequency shift keyed signals corresponding to the information signal when the operating mode is the transmit mode.

30. An apparatus that includes an antenna for transmitting an information signal, the apparatus comprising:

a tuning array that is coupled to the antenna, wherein the tuning array is responsive to a tuning control signal;

a modulation tuner that is coupled to the antenna, wherein the modulation tuner includes a tuning element that is responsive to a modulation control signal, wherein the tuning array, the modulation tuner, and the antenna form a tuned circuit that has an associated resonant frequency;

an oscillator that is coupled to the tuned circuit such that the oscillator and the tuned circuit form a resonant circuit that provides an antenna oscillation signal that oscillates at the resonant frequency when the oscillator circuit is enabled; and a phase detector that is arranged to provide the modulation control signal by comparing the phase of the antenna oscillation signal to an IF oscillation signal, wherein the IF oscillation signal corresponds to a local oscillator signal that is modulated in response to the information signal such that the resonant frequency of the tuned circuit changes in response to the information signal.

31. The apparatus of claim 30, further comprising: an IF oscillator that is arranged to provide the IF oscillation signal in response to a local oscillator signal and the information signal, wherein the IF oscillation signal corresponds to a modulation of the local oscillator signal in response to the information signal.

32. The apparatus of claim 30, further comprising: an IF oscillator that is arranged to provide the IF oscillation signal in response to a local oscillator signal and a DAC output signal, and a DAC that is arranged to provide the DAC output signal in response to the information signal, wherein the DAC output signal corresponds to an digital-to-analog conversion of the information signal, and wherein the IF oscillation signal corresponds to a modulation of the local oscillator signal in response to the DAC output signal.

33. A method for transmitting an information signal with an antenna, the method comprising:

configuring the antenna to oscillate such that the antenna provides an antenna oscillator signal with an associated resonant frequency;

generating an IF oscillator signal, wherein the IF oscillator signal corresponds to a frequency shift keyed signal that is shifted in response to the information signal;

comparing the phase of the antenna oscillator signal to the phase of an IF oscillation signal to provide a phase difference signal; and adjusting the resonant frequency with a modulation tuner in response to the phase difference signal such that the antenna transmits the information signal as an FM modulated signal using FSK encoding.

* * * * *